(12) United States Patent
Lee et al.

(10) Patent No.: US 9,589,614 B2
(45) Date of Patent: Mar. 7, 2017

(54) MULTI-CHIP MEMORY SYSTEM HAVING CHIP ENABLE FUNCTION

(71) Applicant: Samsung Electronics Co., Ltd., Suwon-si, Gyeonggi-do (KR)

(72) Inventors: Chulseung Lee, Seoul (KR); Kyuwook Han, Seoul (KR); Jake Eu, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/919,068

(22) Filed: Oct. 21, 2015

(65) Prior Publication Data
US 2016/0118088 A1    Apr. 28, 2016

(30) Foreign Application Priority Data
Oct. 28, 2014   (KR) .................. 10-2014-0147257

(51) Int. Cl.
| | | |
|---|---|---|
| *G11C 5/02* | (2006.01) | |
| *G11C 8/06* | (2006.01) | |
| *G11C 8/12* | (2006.01) | |
| *G11C 16/20* | (2006.01) | |
| *G11C 16/08* | (2006.01) | |
| *G11C 16/04* | (2006.01) | |

(52) U.S. Cl.
CPC .............. *G11C 8/06* (2013.01); *G11C 8/12* (2013.01); *G11C 16/08* (2013.01); *G11C 16/20* (2013.01); *G06F 2212/7208* (2013.01); *G11C 16/0483* (2013.01)

(58) Field of Classification Search
CPC .... G11C 7/10; G11C 7/22; G11C 8/06; G11C 8/12; G11C 16/20
USPC ..................................................... 365/189.05
See application file for complete search history.

(56) References Cited

U.S. PATENT DOCUMENTS

| | | | |
|---|---|---|---|
| 7,126,873 B2 * | 10/2006 | See .................. | G11C 16/02 365/185.11 |
| 7,423,452 B1 | 9/2008 | Chirania | |
| 7,521,960 B2 | 4/2009 | Balasubramanian et al. | |
| 7,610,433 B2 | 10/2009 | Randell et al. | |
| 7,676,640 B2 | 3/2010 | Chow et al. | |
| 7,679,133 B2 | 3/2010 | Son et al. | |
| 7,688,628 B2 * | 3/2010 | Grimsrud .......... | G06F 13/4072 365/185.11 |

(Continued)

*Primary Examiner* — Pho M Luu
*Assistant Examiner* — Xiaochun L Chen
(74) *Attorney, Agent, or Firm* — Harness, Dickey & Pierce, P.L.C.

(57) ABSTRACT

A storage device includes first and second nonvolatile memory groups that respectively include first and second nonvolatile memory chips, a memory controller connected to the first and second nonvolatile memory groups in common through input/output lines and at least one control line, and a group select circuit connected to the memory controller through the at least one control line and chip enable lines. The group select circuit is connected to the first and second nonvolatile memory groups through a plurality of first and second chip enable lines, respectively. The group select circuit, in response to receiving a control signal through the at least one control line, is configured to transmit chip enable signals to a selected memory group among the first nonvolatile memory group and the second nonvolatile memory group through selected chip enable lines among the first chip enable lines and the second chip enable lines.

20 Claims, 17 Drawing Sheets

(56) References Cited

U.S. PATENT DOCUMENTS

| | | | |
|---|---|---|---|
| 7,978,516 B2 | 7/2011 | Olbrich et al. | |
| 8,009,475 B2* | 8/2011 | Grimsrud | G06F 13/4072 |
| | | | 365/185.11 |
| 8,069,300 B2 | 11/2011 | Klein | |
| 8,081,526 B1 | 12/2011 | Westbrook et al. | |
| 8,154,946 B2* | 4/2012 | Park | G06F 13/4239 |
| | | | 365/230.02 |
| 8,291,295 B2 | 10/2012 | Harari et al. | |
| 8,504,898 B2 | 8/2013 | Cheng et al. | |
| 8,553,466 B2 | 10/2013 | Han et al. | |
| 8,559,235 B2 | 10/2013 | Yoon et al. | |
| 8,654,587 B2* | 2/2014 | Yoon | G11C 16/0483 |
| | | | 365/185.05 |
| 8,689,079 B2 | 4/2014 | Masuo et al. | |
| 2005/0286284 A1* | 12/2005 | See | G11C 16/02 |
| | | | 365/63 |
| 2007/0245061 A1 | 10/2007 | Harriman | |
| 2009/0003092 A1* | 1/2009 | Grimsrud | G06F 13/4072 |
| | | | 365/189.14 |
| 2010/0091587 A1* | 4/2010 | Grimsrud | G06F 13/4072 |
| | | | 365/189.14 |
| 2010/0232197 A1* | 9/2010 | Park | G06F 13/4239 |
| | | | 365/51 |
| 2011/0233648 A1 | 9/2011 | Seol et al. | |
| 2013/0060981 A1 | 3/2013 | Horn et al. | |
| 2013/0279262 A1* | 10/2013 | Yoon | G11C 16/0483 |
| | | | 365/185.18 |

\* cited by examiner

MULTI-CHIP MEMORY SYSTEM HAVING CHIP ENABLE FUNCTION

CROSS-REFERENCE TO RELATED APPLICATIONS

This U.S. non-provisional patent application claims priority under 35 U.S.C. §119 to Korean Patent Application No. 10-2014-0147257, filed on Oct. 28, 2014, the entire contents of which are hereby incorporated by reference.

BACKGROUND

Inventive concepts relate to a semiconductor memory, and more particularly, to a storage device including a plurality of nonvolatile memory chips.

A storage device is a device configured to store data according to a control of a host device such as a computer, a smart phone, a smart pad, etc. A storage device may include a device storing data in a magnetic disc such as a hard disk drive HDD, a solid state drive SSD, a semiconductor memory such as a memory card. A storage device may include a device storing data in a nonvolatile memory.

Types of nonvolatile memory include a ROM (read only memory), a PROM (programmable ROM), an EPROM (electrically programmable ROM), an EEPROM (electrically erasable and programmable ROM), a flash memory, a PRAM (phase-change RAM), a RRAM (resistive RAM), a FRAM (ferroelectric RAM), etc.

As semiconductor manufacturing technology develops, computing devices (e.g., a computer, a smart phone and a smart pad) are widely used. As functions of computing devices become more developed, computing devices may use more capacity to drive application programs and/or provide content. To cover the high capacity of the application programs and the contents, high capacity of the storage device is desirable.

SUMMARY

Example embodiments of inventive concepts relate to a storage device. The storage device may include a first nonvolatile memory group including a plurality of first nonvolatile memory chips; a second nonvolatile memory group including a plurality of second nonvolatile memory chips; a memory controller connected to the first nonvolatile memory group and the second nonvolatile memory group in common through a plurality of input/output lines and at least one control line; and a group select circuit connected to the memory controller through the at least one control line and a plurality of chip enable lines. The group select circuit is connected to the first nonvolatile memory group through a plurality of first chip enable lines and to the second nonvolatile memory group through a plurality of second chip enable lines. The group select circuit, in response to a receiving control signal through the at least one control line, is configured to transmit chip enable signals to a selected memory group among the first nonvolatile memory group and the second nonvolatile memory group. The group select circuit is configured to transmit the chip enable signals to the selected memory group through selected chip enable lines among the first chip enable lines and the second chip enable lines.

In example embodiments, the memory controller may be configured to drive the at least one control line according to a first pattern when accessing one of the first nonvolatile memory group and the second nonvolatile memory group. The memory controller may be configured to drive the at least one control line according to a second pattern when controlling the group select circuit. The second pattern may be different from the first pattern.

In example embodiments, the first nonvolatile memory group and the second nonvolatile memory group may be configured to ignore signals transmitted through the at least one control line when the at least one control line is driven according to the second pattern.

In example embodiments, the at least one control line may include a command latch enable line and an address latch enable line. The memory controller may be configured to transmit a command latch enable signal to the first nonvolatile memory group and the second nonvolatile memory group through the command latch enable line. The memory controller may be configured to transmit the address latch enable signal to the first nonvolatile memory group and the second nonvolatile memory group through the address latch enable signal line.

In example embodiments, the memory controller may be configured to activate only one of the command latch enable signal and the address latch enable signal at once when accessing the first nonvolatile memory group and the second nonvolatile memory group.

In example embodiments, the memory controller may be configured to activate both the command latch enable signal and the address latch enable signal at once when accessing the group select circuit.

In example embodiments, the at least one control line may further include a write enable line. The memory controller may be configured to transmit a write enable signal to the first nonvolatile memory group and the second nonvolatile memory group through the write enable line. When accessing the group select circuit, the memory controller may be configured to drive both the command latch enable signal and address latch enable signal in an activation state and to output information indicating one of the first nonvolatile memory group and the second nonvolatile memory group through the chip enable lines in synchronization with the write enable signal.

In example embodiments, when accessing the group select circuit, the memory controller may be configured to drive both the command latch enable signal and address latch enable signal in an activation state and to output information indicating one of the first nonvolatile memory group and the second nonvolatile memory group through the chip enable lines in synchronization with a concurrent activation of the command latch enable signal and address latch enable signal.

In example embodiments, the at least one control line may further include a clock line. The memory controller may be configured to transmit a clock signal through the clock line to the first nonvolatile memory group and the second nonvolatile memory group. When accessing the group select circuit, the memory controller may be configured to drive both the command latch enable signal and address latch enable signal in an activation state within one cycle of the clock signal and to control a duty ratio that the command latch enable signal and address latch enable signal are in the activation state within one cycle to indicate one of the first nonvolatile memory group and the second nonvolatile memory group.

In example embodiments, the at least one control line may further include a clock line. The memory controller may be configured to transmit a clock signal through the clock line to the first nonvolatile memory group and the second nonvolatile memory group. When accessing the group select circuit, the memory controller may be configured to drive both the command latch enable signal and address latch enable signal in an activation state within one cycle of the clock signal and to control a time when the command latch enable signal an address latch enable signal are activated within one cycle to indicate one of the first nonvolatile memory group in the second nonvolatile memory group.

In example embodiments, the memory controller may be configured to control the group select circuit so that the group select circuit selects a group that is an access target between the first nonvolatile memory group in the second nonvolatile memory group.

In example embodiments, in the case that a group selected by the group select circuit between the first nonvolatile memory group and the second nonvolatile memory group is different from an access target, the memory controller may be configured to control the group select circuit so that the group select circuit selects a group that is the access target.

In example embodiments, the memory controller may be configured to transmit a command and an address to the first nonvolatile memory group or the second nonvolatile memory group through the plurality of input/output lines.

According to example embodiments of inventive concepts, a storage device may include a plurality of first nonvolatile memory chips; a plurality of second nonvolatile memory chips; a memory controller connected to the first nonvolatile memory chips and the second nonvolatile memory chips in common through a plurality of input/output lines; and a group select circuit connected to the memory controller through a plurality of chip enable lines. Under the control of the memory controller, the group select circuit is configured to electrically connect the chip enable lines to nonvolatile memory chips selected among the first nonvolatile memory chips and the second nonvolatile memory chips. The memory controller is further configured to communicate with the selected nonvolatile memory chips through the input/output lines.

In example embodiments, the memory controller may be configured to control the group select circuit through at least one control line connected to the memory controller, the group select circuit, the first nonvolatile memory chips and the second nonvolatile memory chips in common.

According to example embodiments, a storage device includes chip enable lines; first chip enable lines; second chip enable lines; first control lines; second control lines; input/output lines; a first nonvolatile memory group including a plurality of first nonvolatile memory chips; a second nonvolatile memory group including a plurality of second nonvolatile memory chips; a memory controller connected to the first nonvolatile memory group and the second nonvolatile memory group in common through the first control lines, second control lines, and input/output lines; and a group select circuit connected to the memory controller through the chip enable lines. The group select circuit is connected to the first nonvolatile memory group through the first chip enable lines. The group select circuit is connected to the second nonvolatile memory group through the second chip enable lines. The group select circuit is configured to receive chip enable signals from the memory controller. The group select circuit is configured to route the chip enable signals to a selected nonvolatile memory group among the first nonvolatile memory group and the second nonvolatile memory group while the chip enable signals are not routed to an unselected nonvolatile memory group among the first nonvolatile memory group and the second nonvolatile memory group.

In example embodiments, the memory controller may be configured to activate a selected memory chip in the selected memory block based on driving the chip enable signals to the selected memory block through the group select circuit.

In example embodiments, the selected memory chip may be configured to extract a memory command based on first control signals, second control signals, and input/output signals transmitted from the memory controller to the selected memory chip.

In example embodiments, the memory controller may be configured to transmit a command latch enable signal, an address enable signal, and a write enable signal to the selected nonvolatile memory group through the first control lines. The group select circuit may be configured to extract select information from the chip enable signals in synchronization with a rising edge of the write enable signal in a state where the command latch enable signal and the address enable signal are all activated. The group select circuit may be configured to output the extracted select information to the selected nonvolatile memory group.

In example embodiments, the first nonvolatile memory chips and the second nonvolatile memory chips may each include a plurality of memory blocks. Each of the memory blocks may include a plurality of cell strings arranged in rows and columns. Each of the cell strings may include a plurality of memory cells stacked on top of each other between a ground selection line and a string selection line. Each of the cell strings in a same column may be connected to a same bit line in common. The cell strings in a same row may be connected in common to corresponding word lines.

BRIEF DESCRIPTION OF THE FIGURES

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF EXAMPLE EMBODIMENTS

Figure 1:
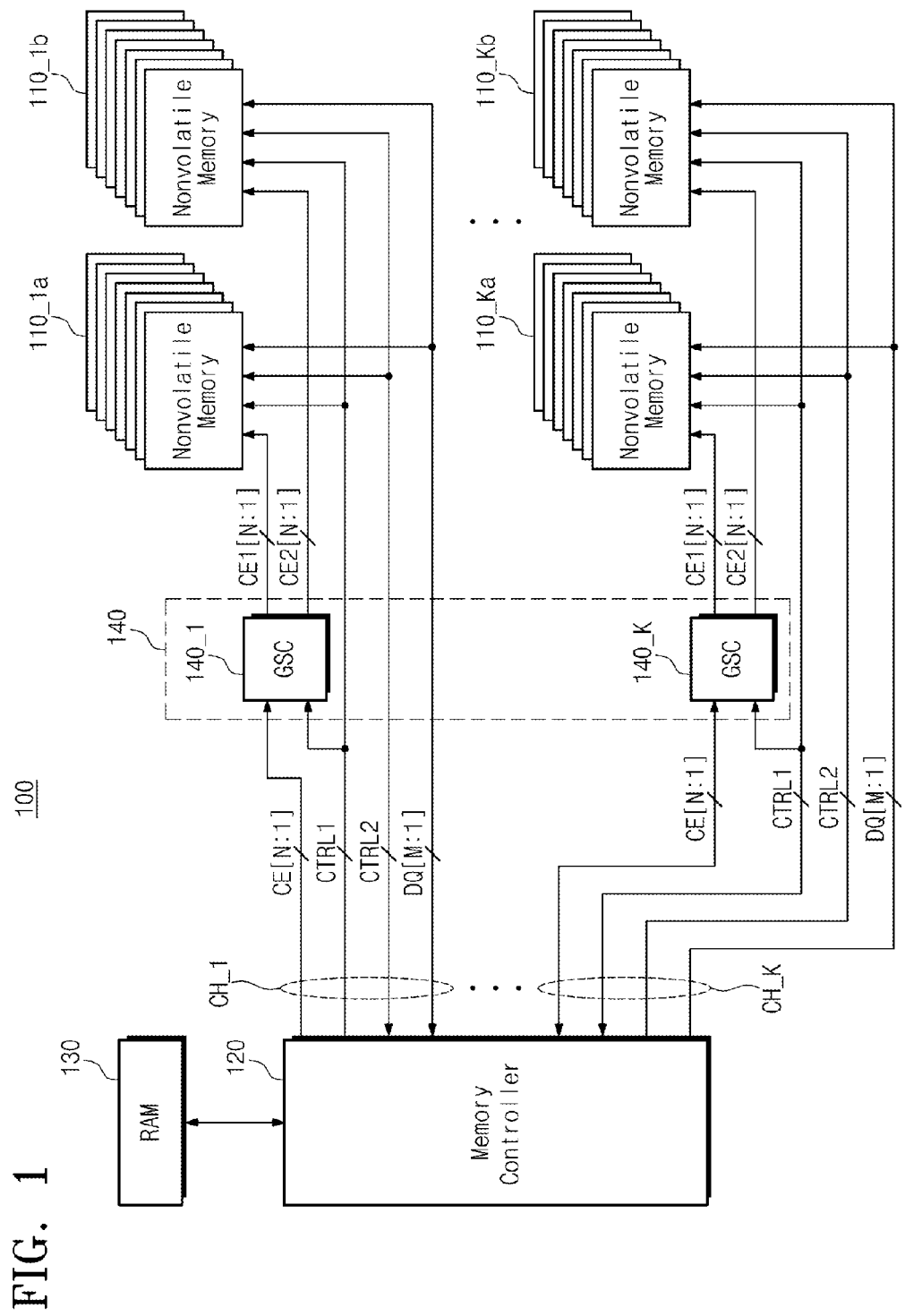
FIG. 1 is a block diagram illustrating a storage device in accordance with example embodiments of inventive concepts.

Example embodiments of inventive concepts will be described more fully hereinafter with reference to the accompanying drawings, in which some example embodiments are shown. Example embodiments may, however, be embodied in many different forms and should not be construed as limited to the embodiments set forth herein. Rather, these example embodiments are provided so that this disclosure will be thorough and complete, and will fully convey the scope of inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a block diagram illustrating a storage device 100 in accordance with example embodiments of inventive concepts. Referring to FIG. 1, the storage device 100 includes nonvolatile memory groups 110_1a~110_Ka, and 110_1b~110_Kb, a memory controller 120, a RAM 130, and a group select circuit that includes first through kth group select circuits 140_1~140_K. The nonvolatile memory groups 110_1a~110_Ka may be first nonvolatile memory groups. The nonvolatile memory groups 110_1b~110_Kb may be second nonvolatile memory groups.

Each of the nonvolatile memory groups 110_1a~110_Ka, and 110_1b~110_Kb includes a plurality of memory chips (or a plurality of memory dies). For example, each of the nonvolatile memory groups 110_1a~110_Ka, and 110_1b~110_Kb may include N number of nonvolatile memory chips (N is a positive integer greater than or equal to 1). Memory chips of each of the nonvolatile memory groups 110_1a~110_Ka, and 110_1b~110_Kb may have the same structure. The nonvolatile memory groups 110_1a~110_Ka, and 110_1b~110_Kb may have the same structure. The nonvolatile memory groups 110_1a~110_Ka, and 110_1b~110_Kb may include at least one of various nonvolatile memories such as a flash memory, a PRAM (phase-change RAM), a MRAM (magnetic RAM), a FRAM (ferroelectric RAM), a RRAM (resistive RAM), etc.

The memory controller 120 can communicate with an external host device (not shown). The memory controller 120 can communicate with the RAM 130. The memory controller 120 can use the RAM 130 as a buffer memory, a cache memory, or an operation memory. For example, the memory controller 120 can receive data from a host device, store the received data in the RAM 130 and write the data stored in the RAM 130 in the nonvolatile memory groups 110_1a~110_Ka, and 110_1b~110_Kb. The memory controller 120 can read data from the nonvolatile memory groups 110_1a~110_Ka, and 110_1b~110_Kb, store the read data in the RAM 130 and output the data stored in the RAM 130 to the host device as data. The memory controller 120 can store the data read from the nonvolatile memory groups 110_1a~110_Ka, and 110_1b~110_Kb in the RAM 130 and write the data stored in the RAM 130 in the nonvolatile memory groups 110_1a~110_Ka, and 110_1b~110_Kb again.

The memory controller 120 can store data or codes used to manage the nonvolatile memory groups 110_1a~110_Ka, and 110_1b~110_Kb in the RAM 130. For example, the memory controller 120 can read data or codes used to manage the nonvolatile memory groups 110_1a~110_Ka, and 110_1b~110_Kb from the data or codes used to manage the nonvolatile memory groups 110_1a~110_Ka, and 110_1b~110_Kb and load the data or the codes in the RAM 130 to drive it.

The memory controller 120 can communicate with the first through kth group select circuits 140_1~140_K and the nonvolatile memory groups 110_1a~110_Ka and 110_1b~110_Kb through first through Kth channels CH_1~CH_K. In each channel, the memory controller 120 is connected to first through Nth chip enable lines through which first through Nth chip enable signals CE[N:1] are transmitted, first control lines through which first control signals CTRL1 are transmitted, second control lines through which second control signals CTRL2 are transmitted and first through Mth input/output lines through which first through Mth input/output signals DQ[M:1] are transmitted.

In each channel CH, the first through Nth chip enable lines may be provided between the memory controller 120 and the group select circuit 140. The first through Nth chip enable lines or the number of the first through Nth chip enable signals CE[N:1] may be the same as the number of nonvolatile memory chips being provided to each nonvolatile memory group. The first through Nth chip enable signals CE[N:1] may indicate one nonvolatile memory chip that is an access target among the nonvolatile memory chips of each nonvolatile memory group.

In each channel CH, the first through Mth input/output lines may be provided between the memory controller 120 and the nonvolatile memory groups (e.g., 110_1a and 110_1b). The first through Mth input/output lines may be connected to the nonvolatile memory groups (e.g., 110_1a and 110_1b) that belong to each channel CH in common. In each channel CH, as the first through Mth input/output signals DQ[M:1], the memory controller 120 can transmit a command and an address to the nonvolatile memory groups (e.g., 110_1a and 110_1b). In each channel CH, as the first through Mth input/output signals DQ[M:1], the memory controller 120 can exchange data with the nonvolatile memory groups (e.g., 110_1a and 110_1b).

In each channel CH, the memory controller 120 can communicate a command latch enable signal CLE indicating that the first through Mth input/output signals DQ[M:1] include a command, an address latch enable signal ALE indicating that first through Mth input/output signals DQ[M:1] include an address, a read enable signal /RE being generated by the memory controller 120 in a read operation and periodically being toggled to be used to adjust timing, a write enable signal /WE being activated by the memory controller 120 when a command or an address is transmitted and indicating timing of latching the command or the address, a write protection signal /WP being activated by the memory controller 120 to limit and/or prevent unwanted write or erase when power supply is changed, a data strobe signal DQS being generated by the memory controller 120 in a write operation and periodically being toggled to be used to adjust an input sync of data, a ready and busy signal R/nB indicating whether the nonvolatile memory chip is performing an program, erase or read operation, and a data strobe signal DQS being generated from the read enable signal /RE by the nonvolatile memory chip in a read operation and periodically being toggled to be used to adjust an output sync of data as the first control signal CTRL1 and the second control signal CTRL2.

The command latch enable signal CLE, the address latch enable signal ALE, the read enable signal /RE, the write enable signal /WE, the write protection signal /WP, the data strobe signal DQS and the ready and busy signal R/nB may be transmitted through a command latch enable line, an address latch enable line, a read enable line, a write enable line, a write protection line, a data strobe line and a ready and busy line respectively.

For example, in each channel CH, a part of the command latch enable signal CLE, the address latch enable signal ALE, the read enable signal /RE, the write enable signal /WE, the write protection signal /WP, the data strobe signal DQS and the ready and busy signal R/nB may be used as the first control signals CTRL1 and the other part thereof may be used as the second control signals CTRL2. For example, signals being output from the memory controller 120 may be used as the first control signals CTRL1.

In each channel CH, first control lines being used to transfer the first control signal CTRL1 may be connected to the memory controller 120, the group select circuit 140 and the nonvolatile memory groups (e.g., 110_1a and 110_1b). In each channel CH, the first control lines may be connected to the nonvolatile memory groups (e.g., 110_1a and 110_1b) in common. In example embodiments, the first control lines being used to transfer the first control signal CTRL1 may be connected between the memory controller 120 and the nonvolatile memory groups (e.g., 110_1a and 110_1b) through the group select circuit. The first control lines may be connected to the nonvolatile memory groups 110_a and 110b in common through the group select circuit 140.

In each channel CH, second control lines being used to transfer the second control signal CTRL2 may be provided between the memory controller 120 and the nonvolatile memory groups (e.g., 110_1a and 110_1b). In each channel CH, the second control lines may be connected to the nonvolatile memory groups (e.g., 110_1a and 110_1b) in common.

In each channel CH, the group select circuit 140 receives the first through Nth chip enable signals CE[N:1] from the memory controller 120 through the first through Nth chip enable lines. In each channel CH, the group select circuit 140 receives the first control signals CTRL1 from the memory controller 120 through the first control lines. In each channel CH, in response to the first control signals CTRL1 or the first through Nth chip enable signals CE[N:1], the group select circuit 140 can select one group of the nonvolatile memory groups (e.g., 110_1a and 110_1b).

In each channel CH, the group select circuit 140 is connected to the first nonvolatile memory groups (e.g., 110_1a) through the first through Nth chip enable lines, through which the first through Nth chip enable signals CE1[N:1] may be transmitted, and is connected to the second nonvolatile memory groups (e.g., 110_b_1) through first through Nth chip enable lines, through which first through Nth chip enable signals CE2[N:1] may be transmitted. In response to the first control signals CTRL1 or the first through Nth chip enable signals CE[N:1] transmitted from the memory controller 120, the group select circuit 140 may transmit the first through Nth chip enable signals CE[N:1] from the memory controller 120 to the first through Nth chip enable lines of the first nonvolatile memory group (e.g., 110_1a) or may transmit the first through Nth chip enable lines of the second nonvolatile memory group (e.g., 110_1b). For example, in each channel CH, in response to the first control signals CTRL1 or the first through Nth chip enable signals CE[N:1] transmitted from the memory controller 120, the group select circuit 140 may transmit the first through Nth chip enable signals CE[N:1] from the memory controller 120 to memory chips of the selected nonvolatile memory group.

When accessing a specific nonvolatile memory chip that belongs to a specific channel, the memory controller 120 can select a channel that is an access target among the channels CH_1~CH_K. In the selected channel, the memory controller 120 can control the group select circuit 140 to select a nonvolatile memory group that is an access target among the nonvolatile memory groups (e.g., 110_1a and 110_1b). The memory controller 120 can communicate the first through Nth chip enable signals CE[N:1], the first control signals CTRL1, the second control signals CTRL2 and the first through Mth input/output signals DQ[M:1] through the selected channel. The first through Nth chip enable signals CE[N:1] may be transmitted to the selected nonvolatile memory group of the selected channel by the group select circuit 140. Among the nonvolatile memory chips, a nonvolatile memory chip indicated by the first through Nth chip enable signals CE[N:1] may be activated in the selected nonvolatile memory group of the selected channel.

For example, the first through Nth chip enable signals CE[N:1] may be transmitted to nonvolatile memory chips of the selected nonvolatile memory group respectively. A nonvolatile memory chip that receives an activated chip enable signal among the first through Nth chip enable signals CE[N:1] may be activated. Nonvolatile memory chip(s) that receive inactivated chip enable signals among the first through Nth chip enable signals CE[N:1] can maintain an inactivation state.

The activated nonvolatile memory chip communicates the first control signals CTRL1, the second control signals CTRL2 and the first through Mth input/output signals DQ[M:1] through the selected channel. For example, the activated nonvolatile memory chip may receive the first control signals CTRL1, the second control signals CTRL2 and the first through Mth input/output signals DQ[M:1] from the memory controller 120 through the selected channel. The memory controller 120 can communicate with a selected nonvolatile memory chip of the selected nonvolatile memory group of the selected channel among the plurality of nonvolatile memory chips of the nonvolatile memory groups 110_1a~110_ka and 110_1b~110_kb of the channels CH_1~CH_K.

In a conventional case, for example a conventional storage device, the memory controller is configured to directly transmit the chip enable signals to the nonvolatile memory chips through separate chip enable signal lines for each of the nonvolatile memory chips. However, due to a limit of a size of the memory controller and interconnection lines being connected to the memory controller, the number of the chip enable lines that may connect to the memory controller may be limited. According to example embodiments of inventive concepts, the first through Nth chip enable signals CE[N:1] output from the memory controller 120 are routed by the group select circuit 140 and may be transmitted to the selected nonvolatile memory group. Thus, the number of the nonvolatile memory chips that communicate with the memory controller 120 is increased even without adding more chip enable lines that connect to the memory controller 120. Thus, since the number of nonvolatile memory chips being accessed by the memory controller 120 is increased without an increase of a design change and a size increase of the memory controller 120, in example embodiments, the high capacity storage device 100 of low manufacturing cost, low complexity and small size is provided.

Each nonvolatile memory group 110 may be formed in one nonvolatile memory package. The memory controller 120 may be formed in a memory controller package and the RAM 130 may be formed in a RAM package. Each group select circuit 140 may be provided in a programmable package such as a CPLD (complex programmable logic device) and a FPGA (field programmable gate array). Each group select circuit 140 may be provided in a custom package like an ASIC (application specific integrated circuit). Each group select circuit 140 (e.g., 140_1 to 140_k) may be provided in a combination of discrete components that can be placed in a printed circuit board PCB.

The controller 120, in conjunction with the RAM 130, may be configured as a special purpose control circuit that, when executing instructions from a host, may control the group select circuit (e.g., 140_1) to select a nonvolatile memory group that is an access target among the nonvolatile memory groups (e.g., 110_1a and 110_1b), and transmit the first through Nth chip enable signals CE[N:1] to the selected nonvolatile memory group. A nonvolatile memory chip, which is indicated by the first through Nth chip enable signals CE[N:1], in the selected nonvolatile memory group may be activated. The controller 120 may improve the functioning of the storage itself by increasing the number of the nonvolatile memory chips that communicate with the memory controller 120 without adding more chip enable lines that connect to the memory controller 120. Also, more nonvolatile memory groups may be controlled by the memory controller 120 without adding more chip enable lines that connect to the memory controller 120.

The nonvolatile memory groups (e.g., 110_1a and 110_1b) that belong to one channel CH may be formed in one package together with the group select circuit 140. The group select circuit 140 may be provided by a semiconductor chip.

In FIG. 1, the number of the channels of the storage device 100, the number of the nonvolatile memory groups of each channel, and the number of the nonvolatile memory chips of each nonvolatile memory group are illustrative but do not limit inventive concepts. For example, the number of the channels of the storage device 100, the number of the nonvolatile memory groups of each channel, and the number of the nonvolatile memory chips of each nonvolatile memory group may be variously applied and changed.

In FIG. 1, it is illustrated that one group select circuit is included in one channel, but inventive concepts is not limited thereto. For example, one group select circuit may be provided to two channels or one group select circuit may be provided to four channels.

Figure 2:
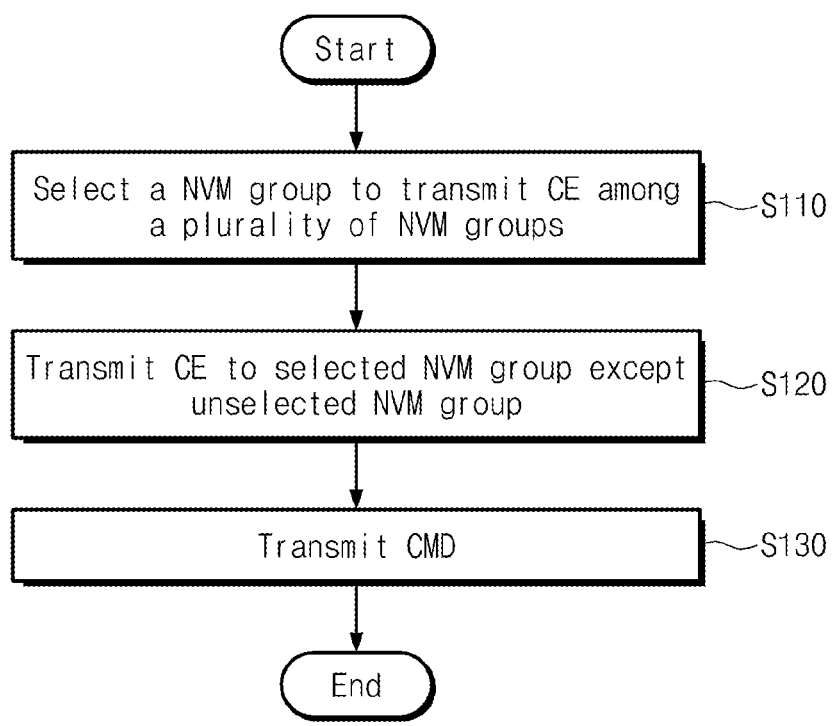
FIG. 2 is a flow chart illustrating an example of an operation method of a storage device in accordance with example embodiments of inventive concepts.

FIG. 2 is a flow chart illustrating an example of an operation method of a storage device 100 in accordance with example embodiments of inventive concepts. Referring to FIGS. 1 and 2, in an operation S110, the storage device 100 selects a nonvolatile memory group to which transmit the first through Nth chip enable signals CE[N:1] among the nonvolatile memory groups. For example, the memory controller 120 can select a channel CH that is an access target. In the selected channel CH, the memory controller 120 can control the group select circuit 140 using the first through Nth chip enable signals CE[N:1] or the first control signals CTRL1 to select the nonvolatile memory group that is an access target among the nonvolatile memory groups (e.g., 110_1a and 110_1b) of the selected channel CH.

In an operation S120, the storage device 100 transmits the first through Nth chip enable signals CE[N:1] to the selected nonvolatile memory group except unselected nonvolatile memory group. The memory controller 120 can output the first through Nth chip enable signals CE[N:1] through the first through Nth chip enable lines of the selected channel CH. The group select circuit 140 of the selected channel CH can transmit the first through Nth chip enable signals CE[N:1] output from the memory controller 120 only to the selected nonvolatile memory group. A nonvolatile memory chip indicated by the first through Nth chip enable signals CE[N:1] among nonvolatile memory chips of the selected nonvolatile memory group is activated and the remaining nonvolatile memory chips, that is, the nonvolatile memory chips not indicated by the first through Nth chip enable signals CE[N:1] among the nonvolatile memory chips of the selected nonvolatile memory group and the nonvolatile memory chips of the unselected nonvolatile memory group are not activated.

In an operation S130, the storage device 100 transmits a command CMD. The memory controller 120 can transmit the first control signals CTRL1, the second control signals CTRL2 and the first through Mth input/output signals DQ[M:1] through the first control lines, the second control lines and the first through Mth input/output lines of the selected channel CH respectively. In the selected channel CH, the activated nonvolatile memory chip of the selected nonvolatile memory group can receive a command CMD according to the first control signals CTRL1, the second control signals CTRL2 and the first through Mth input/output signals DQ[M:1]. In the selected channel CH, the inactivated nonvolatile memory chips may neglect the first control signals CTRL1, the second control signals CTRL2 and the first through Mth input/output signals DQ[M:1].

Figure 3:
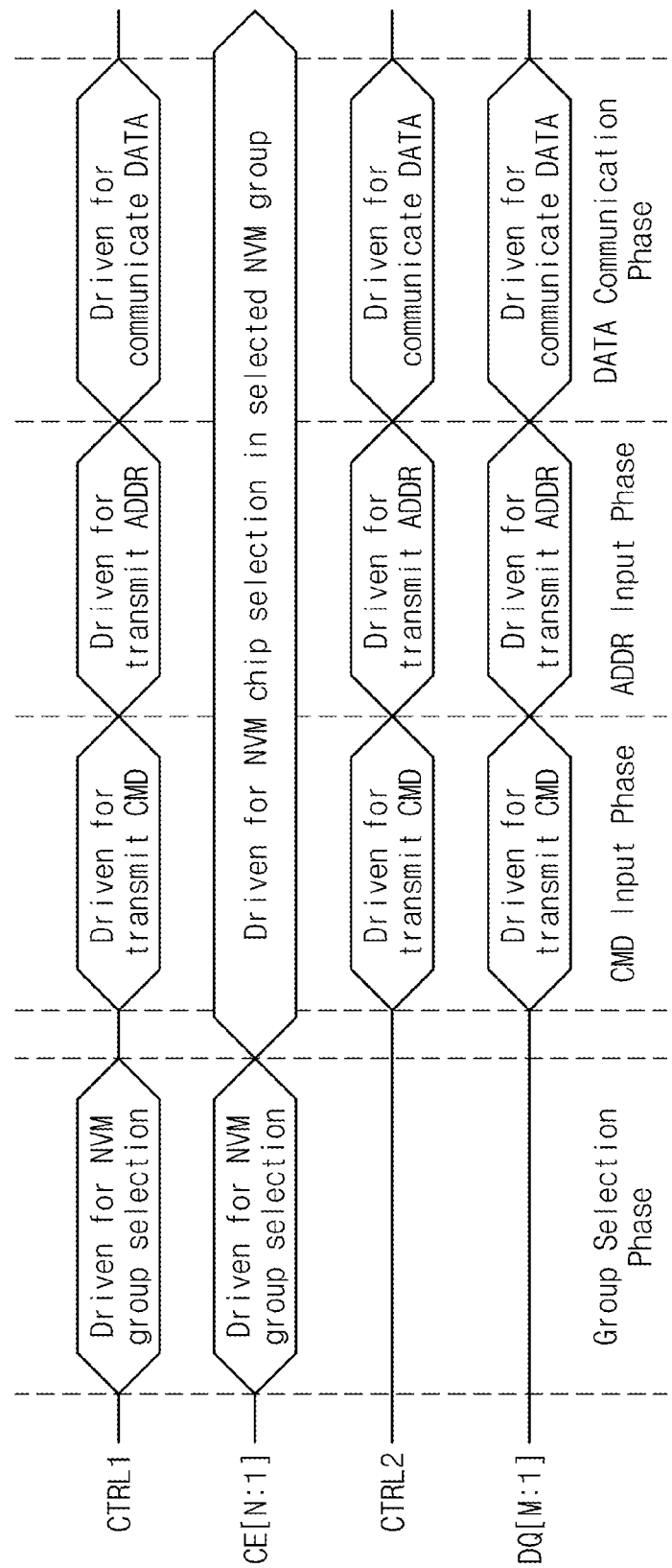
FIG. 3 is a timing diagram illustrating signals being transmitted when a memory controller communicates with a nonvolatile memory chip.

FIG. 3 is a timing diagram illustrating signals being transmitted when a memory controller communicates with a nonvolatile memory chip. An example of signals being transmitted in a selected channel among the channels CH_1~CH_K is illustrated in FIG. 3.

Referring to FIG. 3, the memory controller 120 can control signals according to a group select phase, a command input phase, an address input phase, and a data communication phase.

In the group select phase, the memory controller 120 drives the first control signal CTRL1 and the first through Nth chip enable signals CE[N:1] so that the nonvolatile memory group that is an access target is selected among the nonvolatile memory groups (e.g., 110_1a and 110_1b). If the group select phase is selected, a nonvolatile memory group which communicates with the memory controller 120 is selected among the nonvolatile memory groups (e.g., 110_1a and 110_1b) of the selected channel.

If the nonvolatile memory group is selected, the memory controller 120 drives the first through Nth chip enable signals CE[N:1] so that a nonvolatile memory chip that is an access target among the nonvolatile memory chips of the selected nonvolatile memory group is activated. The first through Nth chip enable signals CE[N:1] are transmitted to the selected nonvolatile memory group through the group select circuit 140.

In the command input phase, the memory controller 120 controls the first control signals CTRL1, the second control signals CTRL2 and the first through Mth input/output signals DQ[M:1] according to a command CMD to be transmitted to the activated nonvolatile memory chip. The memory controller 120 can control the first control signals CTRL1, the second control signals CTRL2 and the first through Mth input/output signals DQ[M:1] according to a pattern or a method defined by a standard or a specification of the activated nonvolatile memory chip. The activated nonvolatile memory chip can extract the command CMD from the first control signals CTRL1, the second control signals CTRL2 and the first through Mth input/output signals DQ[M:1] according to the standard or the specification. For example, in the command input phase, various commands (e.g., read, write and erase commands) defined in the standard or the specification of the activated nonvolatile memory chip may be transmitted.

In the address input phase, the memory controller 120 controls the first control signals CTRL1, the second control signals CTRL2 and the first through Mth input/output signals DQ[M:1] according to an address ADDR to be transmitted to the activated nonvolatile memory chip. The memory controller 120 can control the first control signals CTRL1, the second control signals CTRL2 and the first through Mth input/output signals DQ[M:1] according to a pattern or a method defined by a standard or a specification of the activated nonvolatile memory chip. The activated nonvolatile memory chip can extract the address ADDR from the first control signals CTRL1, the second control signals CTRL2 and the first through Mth input/output signals DQ[M:1] according to the standard or the specification.

In the data communication phase, the memory controller 120 controls the first control signals CTRL1, the second control signals CTRL2 and the first through Mth input/output signals DQ[M:1] according to data transmitted to the activated nonvolatile memory chip. The memory controller 120 can control the first control signals CTRL1, the second control signals CTRL2 and the first through Mth input/output signals DQ[M:1] according to a pattern or a method defined by a standard or a specification of the activated nonvolatile memory chip. The memory controller 120 and the activated nonvolatile memory chip can communicate the data using the first control signals CTRL1, the second control signals CTRL2 and the first through Mth input/output signals DQ[M:1] according to the standard or the specification.

As described with reference to FIG. 3, when the command CMD is input into the nonvolatile memory chip, a pattern or a method of controlling the first control signals CTRL1 or the first through Nth chip enable signals CE[N:1] is defined by the standard or the specification. When data DATA is exchanged with the nonvolatile memory chip, a pattern or a method of controlling the first control signals CTRL1 or the first through Nth chip enable signals CE[N:1] is defined by the standard or the specification. When the first control signals CTRL1 or the first through Nth chip enable signals CE[N:1] is controlled by a pattern or a method not defined in a standard or a specification related to a communication with the activated nonvolatile memory chip, the activated nonvolatile memory chip is configured to neglect the first control signals CTRL1 or the first through Nth chip enable signals CE[N:1].

In the group select phase, the memory controller 120 can drive the first control signals CTRL1 or the first through Nth chip enable signals CE[N:1] using a pattern or a method not defined in a standard or a specification related to a communication with the activated nonvolatile chip. The group select circuit 140 may be configured to select a nonvolatile memory group that is an access target among the nonvolatile memory groups (e.g., 110_1a and 110_1b) in response to the first control signals CTRL1 or the first through Nth chip enable signals CE[N:1] using the pattern or the method not defined in the standard or the specification related to a communication with the activated nonvolatile chip. The group select circuit 140 may be configured to neglect the first control signals CTRL1 or the first through Nth chip enable signals CE[N:1] using the pattern or the method not defined in the standard or the specification related to a communication with the activated nonvolatile chip. As described above, if the memory controller 120 and the group select circuit 140 operate, the group select phase may be performed without affecting the nonvolatile memory chips.

Figure 4:
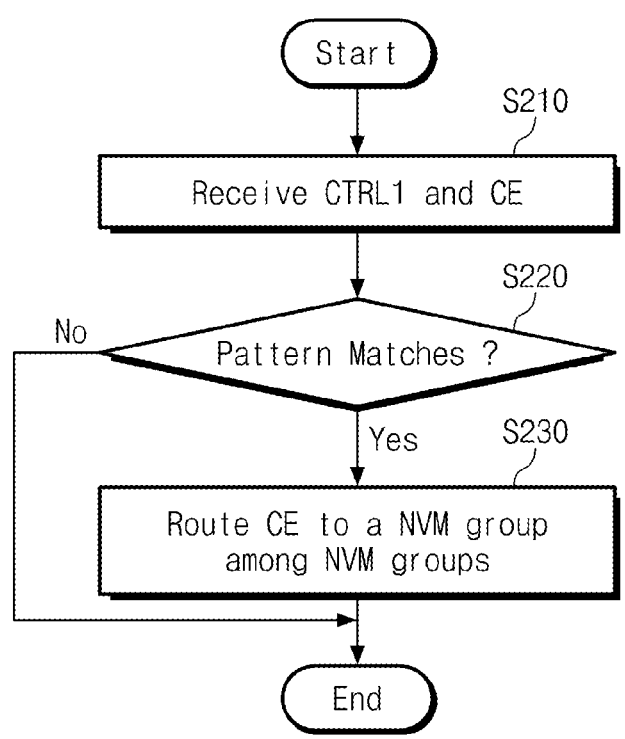
FIG. 4 is a flow chart illustrating an operation method of a group select circuit.

FIG. 4 is a flow chart illustrating an operation method of a group select circuit. Referring to FIGS. 1 and 4, in an operation S210, the group select circuit 140 receives the first control signal CTRL1 or the first through Nth chip enable signals CE[N:1].

In operation S220, the group select circuit 140 determines whether the received first control signal CTRL1 or the received first through Nth chip enable signals CE[N:1] correspond to a desired (and/or alternatively predetermined) pattern. For example, the desired (and/or alternatively predetermined) pattern may be a pattern determined to select one nonvolatile memory group among the nonvolatile memory groups (e.g., 110_1a and 110_1b).

If the received first control signal CTRL1 or the received first through Nth chip enable signals CE[N:1] do not correspond to a desired (and/or alternatively predetermined) pattern, the received first control signal CTRL1 or the received first through Nth chip enable signals CE[N:1] are neglected. If the received first control signal CTRL1 or the received first through Nth chip enable signals CE[N:1] correspond to a desired (and/or alternatively predetermined) pattern, in an operation S230, the group select circuit 140 can select a nonvolatile memory group designated by the first control signals CTRL1 or the first through Nth chip enable signals CE[N:1] among the nonvolatile memory groups (e.g., 110_1a and 110_1b). The group select circuit 140 can set routes of the first through Nth chip enable signals CE[N:1] so that the first through Nth chip enable signals CE[N:1] being received from the memory controller 120 are routed to the selected nonvolatile group.

Figure 5:
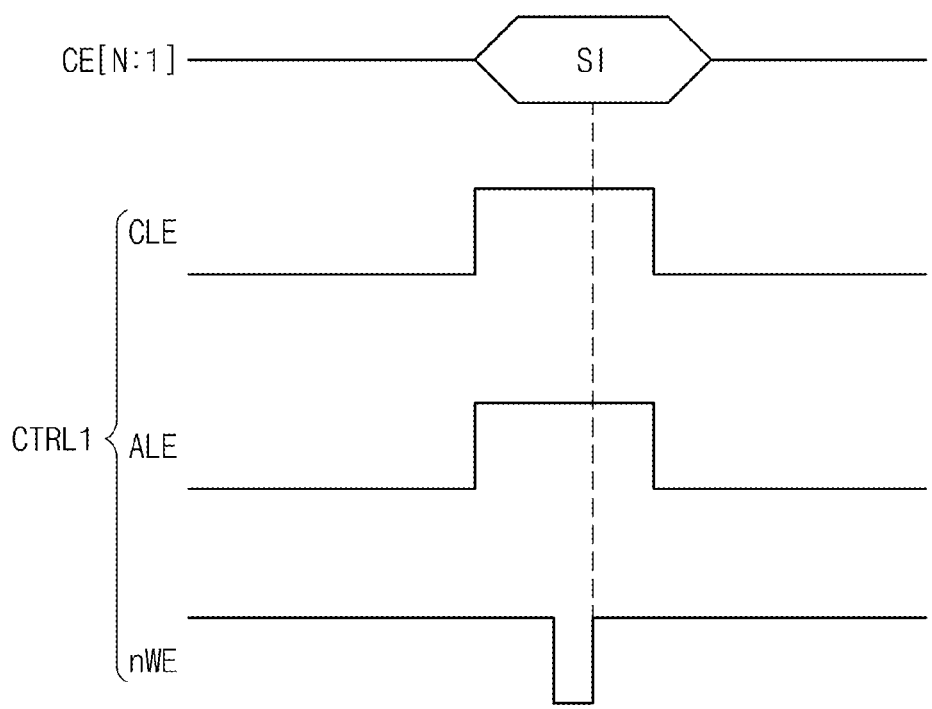
FIG. 5 is a timing diagram illustrating a first example of a group select phase in accordance with example embodiments of inventive concepts.

FIG. 5 is a timing diagram illustrating a first example of a group select phase in accordance with example embodiments of inventive concepts. Referring to FIGS. 1 and 5, the command latch enable signal CLE, the address enable signal ALE and the write enable signal nWE may be used as the first control signals CTRL1.

The command latch enable signal CLE is activated in the command input phase and the address enable signal ALE is activated in the address input phase. A situation that the command latch enable signal CLE and the address enable signal ALE are simultaneously activated is not defined in the standard or the specification, such as the command input phase, the address input phase and the data communication phase, of the nonvolatile memory chip. That is, if the command latch enable signal CLE and the address enable signal ALE are simultaneously activated, the nonvolatile memory chip can neglect signals being input.

When the write enable signal nWE transmits in a state that the command latch enable signal CLE and the address enable signal ALE are simultaneously activated, the group select circuit 140 may refer to the first through Nth chip enable signals CE[N:1]. For example, the group select circuit 140 can extract select information SI from the first through Nth chip enable signals CE[N:1] in synchronization with a rising edge of the write enable signal nWE. When selecting the nonvolatile memory group through the group select circuit 140, the memory controller 120 can toggle the write enable signal nWE in a state that the command latch enable signal CLE and the address enable signal ALE are all activated. The memory controller 120 can output the select information SI through the first through Nth chip enable signals CE[N:1] in synch with a toggle timing of the write enable signal nWE.

According to the first through Nth chip enable signals CE[N:1], the group select circuit 140 can select one group among the nonvolatile memory groups (e.g., 110_1a and 110_1b). For example, the group select circuit 140 can route, for example, electrically connect the first through Nth chip enable lines receiving the first through Nth chip enable signals CE[N:1] from the memory controller 120 to one group of the nonvolatile memory groups (e.g., 110_1a and 110_1b).

For example, when the first through Nth chip enable signals CE[N:1] are all in an inactivation state (or an activation state), the group select circuit 140 can select the first nonvolatile memory group (e.g., 110_1a). When at least one signal among the first through Nth chip enable signals CE[N:1] is in an inactivation state (or an activation state), the group select circuit 140 can select the second nonvolatile memory group (e.g., 110_1b).

According to a pattern of the first through Nth chip enable signals CE[N:1], the group select circuit 140 can select one group among the nonvolatile memory groups (e.g., 110_1a and 110_1b). For example, when among the first through Nth chip enable signals CE[N:1], first signals are in an activation state and second signals are in an inactivation state, the group select circuit 140 can select the first nonvolatile memory group (e.g., 110_1a). When among the first through Nth chip enable signals CE[N:1], third signals are in an activation state and fourth signals are in an inactivation state, the group select circuit 140 can select the second nonvolatile memory group (e.g., 110_1b).

Figure 6:
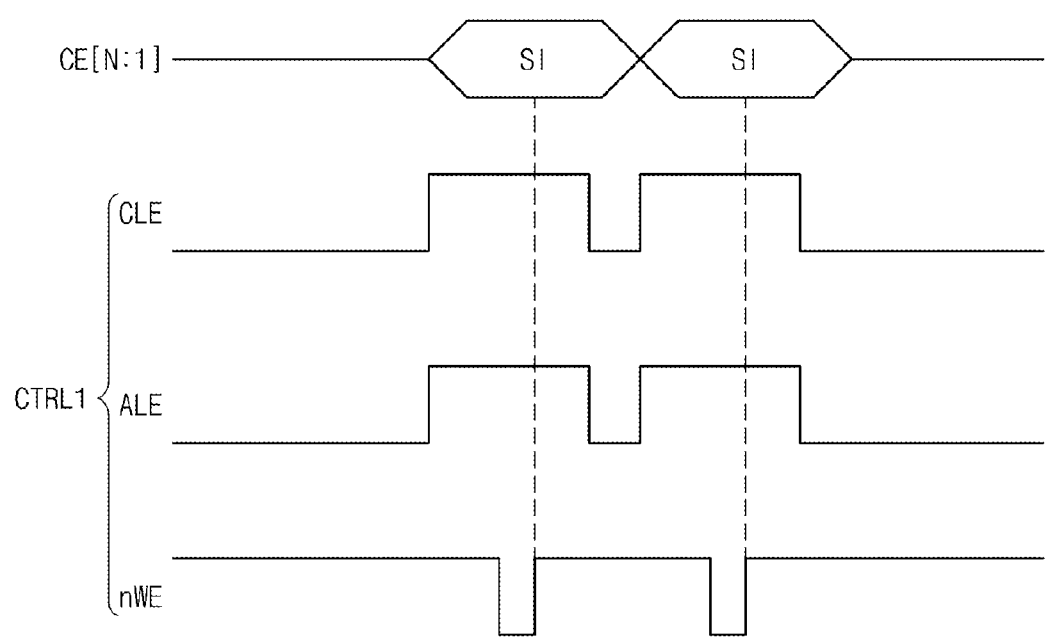
FIG. 6 is a timing diagram illustrating a second example of a group select phase in accordance with example embodiments of inventive concepts.

FIG. 6 is a timing diagram illustrating a second example of a group select phase in accordance with example embodiments of inventive concepts. Referring to FIGS. 1 and 6, the command latch enable signal CLE, the address enable signal ALE and the write enable signal nWE may be used as the first control signals CTRL1.

In comparison with the example of FIG. 5, the select information SI is transmitted from the memory controller 120 to the group select circuit 140 in twice. For example, when the command latch enable signal CLE and the address enable signal ALE are activated firstly and the write enable signal nWE is toggled firstly, the select information SI may be transmitted through the first through Nth chip enable signals CE[N:1] firstly. When the command latch enable signal CLE and the address enable signal ALE are activated secondly and the write enable signal nWE is toggled secondly, the select information SI may be transmitted through the first through Nth chip enable signals CE[N:1] secondly.

When the number of nonvolatile memory groups connected to one channel increase, the select information SI may be extended according to the method illustrated in FIG. 6.

In FIG. 6, while the write enable signal nWE is toggled twice, the command latch enable signal CLE and the address enable signal ALE also repeat an activation and an inactivation. However, while the command latch enable signal CLE and the address enable signal ALE maintain an activation state, the write enable signal nWE may be toggled twice.

Figure 7:
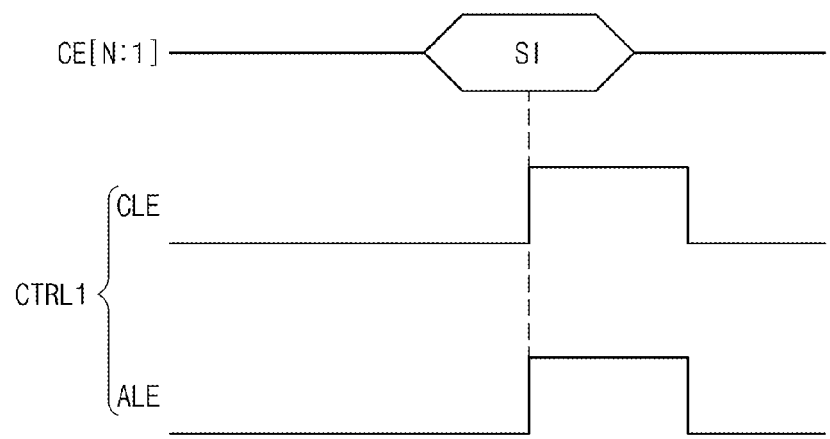
FIG. 7 is a timing diagram illustrating a third example of a group select phase in accordance with example embodiments of inventive concepts.

FIG. 7 is a timing diagram illustrating a third example of a group select phase in accordance with example embodiments of inventive concepts. Referring to FIGS. 1 and 7, the command latch enable signal CLE and the address enable signal ALE may be used as the first control signals CTRL1.

The group select circuit 140 may refer to the first through Nth chip enable signals CE[N:1] at the time when the command latch enable signal CLE and the address enable signal ALE are simultaneously activated. For example, the group select circuit 140 can extract select information SI from the first through Nth chip enable signals CE[N:1] in synchronization with a rising edge of the command latch enable signal CLE and the address enable signal ALE. When selecting the nonvolatile memory group through the group select circuit 140, the memory controller 120 can output the select information SI through the first through Nth chip enable signals CE[N:1] according to the timing of activating both the command latch enable signal CLE and the address enable signal ALE.

The group select circuit 140 can select one group among the nonvolatile memory groups (e.g., 110_1a and 110_1b) on the basis of the first through Nth chip enable signals CE[N:1]. For example, the group select circuit 140 can route, for example, electrically connect the first through Nth chip enable lines receiving the first through Nth chip enable signals CE[N:1] from the memory controller 120 to one group of the nonvolatile memory groups (e.g., 110_1a and 110_1b).

For example, when the first through Nth chip enable signals CE[N:1] are all in an inactivation state (or an activation state), the group select circuit 140 can select the first nonvolatile memory group (e.g., 110_1a). When at least one signal among the first through Nth chip enable signals CE[N:1] is in an inactivation state (or an activation state), the group select circuit 140 can select the second nonvolatile memory group (e.g., 110_1b).

According to a pattern of the first through Nth chip enable signals CE[N:1], the group select circuit 140 can select one group among the nonvolatile memory groups (e.g., 110_1a and 110_1b). For example, when among the first through Nth chip enable signals CE[N:1], first signals are in an activation state and second signals are in an inactivation state, the group select circuit 140 can select the first nonvolatile memory group (e.g., 110_1a). When among the first through Nth chip enable signals CE[N:1], third signals are in an activation state and fourth signals are in an inactivation state, the group select circuit 140 can select the second nonvolatile memory group (e.g., 110_1b).

Figure 8:
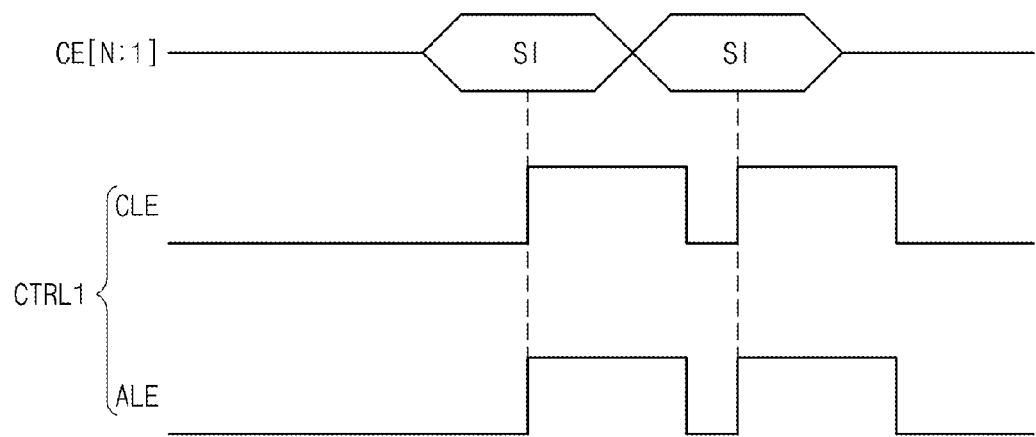
FIG. 8 is a timing diagram illustrating a fourth example of a group select phase in accordance with example embodiments of inventive concepts.

FIG. 8 is a timing diagram illustrating a fourth example of a group select phase in accordance with example embodiments of inventive concepts. Referring to FIGS. 1 and 8, the command latch enable signal CLE and the address enable signal ALE may be used as the first control signals CTRL1.

In comparison with the example of FIG. 7, the select information SI is transmitted from the memory controller 120 to the group select circuit 140 in twice. For example, when the command latch enable signal CLE and the address enable signal ALE are simultaneously activated firstly, the select information SI may be transmitted through the first through Nth chip enable signals CE[N:1] firstly. When the command latch enable signal CLE and the address enable signal ALE are simultaneously activated secondly, the select information SI may be transmitted through the first through Nth chip enable signals CE[N:1] secondly.

When the number of nonvolatile memory groups connected to one channel increase, the select information SI may be extended according to the method illustrated in FIG. 8.

Figure 9:
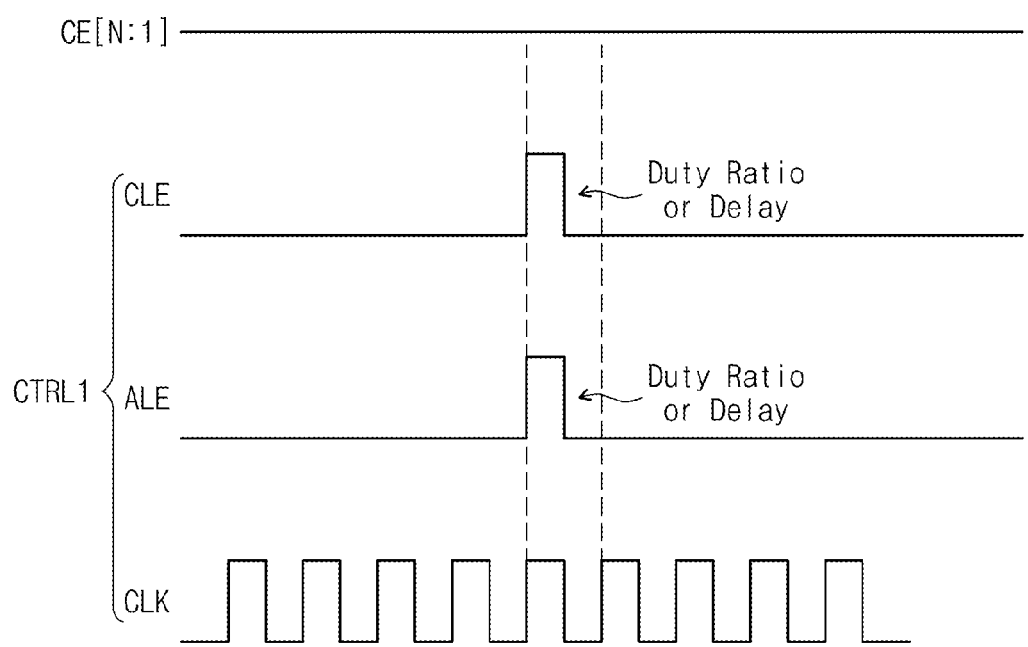
FIG. 9 is a timing diagram illustrating a fifth example of a group select phase in accordance with example embodiments of inventive concepts.

FIG. 9 is a timing diagram illustrating a fifth example of a group select phase in accordance with example embodiments of inventive concepts. Referring to FIGS. 1 and 9, the command latch enable signal CLE, the address enable signal ALE and the first control signals CTRL1 may be used as the first control signals CTRL1.

For example, the memory controller 120 and the nonvolatile memory chips may be configured to exchange a clock CLK instead of a strobe signal DQS. In this case, the memory controller 120 can provide the command latch enable signal CLE, the address enable signal ALE and the clock CLK as the first control signals CTRL1.

When the command latch enable signal CLE and the address enable signal ALE are simultaneously activated and inactivated within one cycle of the clock CLK, the group select circuit 140 can select the nonvolatile memory group on the basis of the command latch enable signal CLE and the address enable signal ALE. That is, the group select circuit 140 can extract the select information SI from the command latch enable signal CLE and the address enable signal ALE being activated and inactivated during one cycle of the clock CLK. The memory controller 120 can transmit the select information SI by activating and inactivating the command latch enable signal CLE and the address enable signal ALE during one cycle of the clock CLK.

When a duty ratio of the command latch enable signal CLE and the address enable signal ALE has a first value, the group select circuit 140 can select the first nonvolatile memory group (e.g., 110_1a). When a duty ratio of the command latch enable signal CLE and the address enable signal ALE has a second value, the group select circuit 140 can select the second nonvolatile memory group (e.g., 110_1b).

When the time when the command latch enable signal CLE and the address enable signal ALE are activated within one cycle of the clock CLK is delayed by the first value, the group select circuit 140 can select the first nonvolatile memory group (e.g., 110_1a). When the time when the command latch enable signal CLE and the address enable signal ALE are activated within one cycle of the clock CLK is delayed by the second value, the group select circuit 140 can select the second nonvolatile memory group (e.g., 110_1b).

The group select circuit 140 can transmit the first through Nth chip enable signals CE[N:1] to the selected nonvolatile memory group.

Figure 10:
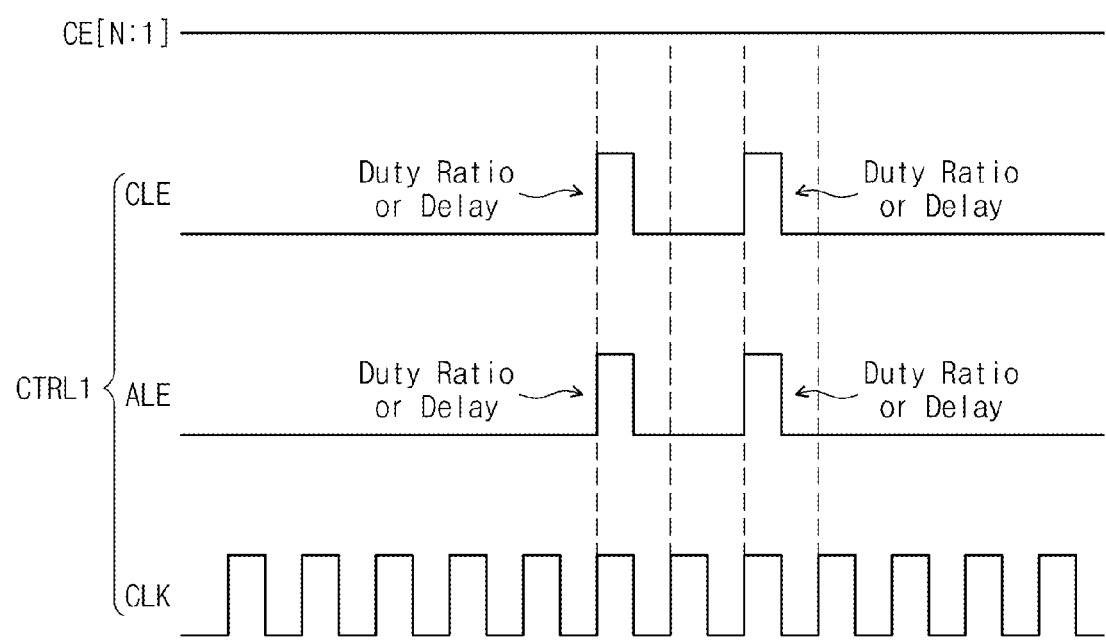
FIG. 10 is a timing diagram illustrating a sixth example of a group select phase in accordance with example embodiments of inventive concepts.

FIG. 10 is a timing diagram illustrating a sixth example of a group select phase in accordance with example embodiments of inventive concepts. Referring to FIGS. 1 and 10, the command latch enable signal CLE, the address enable signal ALE and the first control signals CTRL1 may be used as the first control signals CTRL1.

In comparison with the example of FIG. 9, the select information SI is transmitted from the memory controller 120 to the group select circuit 140 in twice. For example, the command latch enable signal CLE and the address enable signal ALE are simultaneously activated and inactivated firstly during a first cycle of the clock CLK. The command latch enable signal CLE and the address enable signal ALE are simultaneously activated and inactivated secondly during a second cycle of the clock CLK.

When the number of nonvolatile memory groups connected to one channel increase, the select information SI may be extended according to the method illustrated in FIG. 10.

Figure 11:
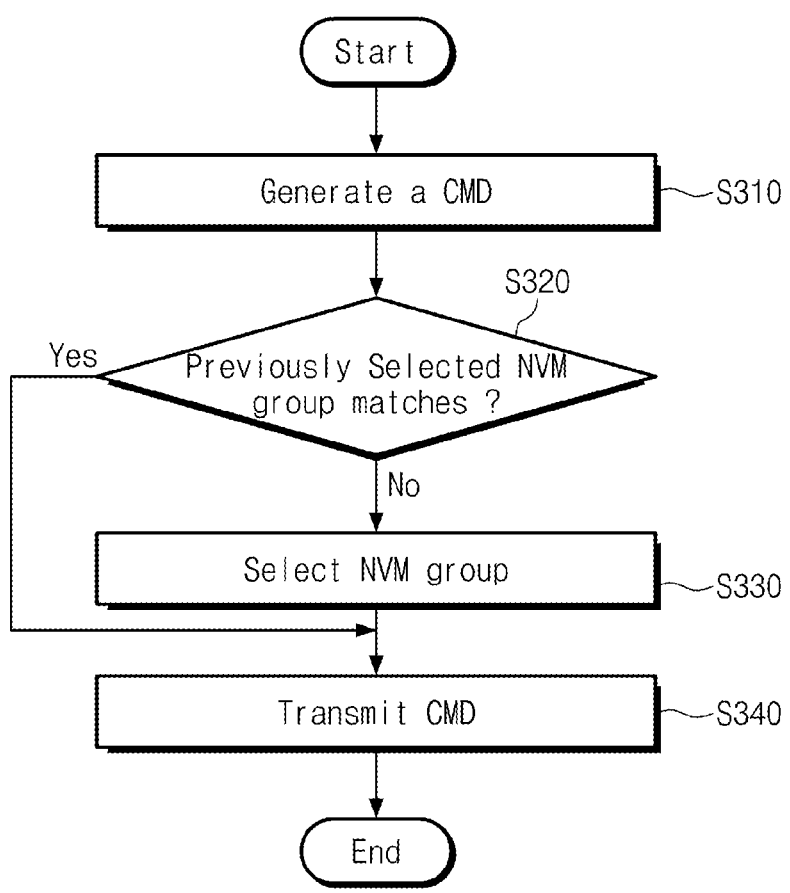
FIG. 11 is a flow chart illustrating another example of an operation method of a storage device in accordance with example embodiments of inventive concepts.

FIG. 11 is a flow chart illustrating another example of an operation method of a storage device 100 in accordance with example embodiments of inventive concepts. Referring to FIG. 11, in an operation S310, a command CMD is generated. The memory controller 120 can generate a command CMD to be transmitted to a target nonvolatile memory chip according to a request of an external host device or an internally-determined schedule.

In an operation S320, the storage device 100 can determine whether the previously selected nonvolatile memory group corresponds to a target nonvolatile memory chip to be transmitted. For example, the memory controller 120 can select a channel to which the target nonvolatile memory chip belongs among the channels CH_1~CH_K. In the selected channel CH, the memory controller 120 can determine whether the group select circuit 140 indicates a nonvolatile memory group to which the target nonvolatile memory chip belongs.

If the previously selected memory group corresponds to the command CMD, in an operation S340, the nonvolatile memory group is not selected again and the command CMD is transmitted. If the previously selected memory group does not correspond to the command CMD, in an operation S330, the nonvolatile memory group to which the target nonvolatile memory chip belongs is selected again. After that, in the operation S340, the command CMD is transmitted.

When a first command is transmitted through the first channel CH1, the nonvolatile memory group 110_1a may be selected by the group select circuit 140. The group select circuit 140 can route the first through Nth chip enable signals CE[N:1] of the memory controller 120 to the nonvolatile memory group 110_1a until being initialized or controlled to select other nonvolatile memory group.

A second command may be transmitted subsequent to the first command. If a target nonvolatile memory chip belongs to the nonvolatile memory group 110_1a selected when the first command is transmitted, the nonvolatile memory group does not need to be selected again. Thus, the memory controller 120 can enter the command input phase without performing the group select phase. If the target nonvolatile memory chip does not belong to the nonvolatile memory group 110_1a selected when the first command is transmitted, the nonvolatile memory group 110_1b to which the target nonvolatile memory chip belongs has to be selected again. Thus, the memory controller 120 can enter the command input phase after performing the group select phase.

As described with reference to FIG. 11, the memory controller 120 may be configured to perform the group select phase only when the previously selected nonvolatile memory group does not correspond to the target nonvolatile memory chip. In example embodiments, regardless of the previously selected nonvolatile memory group, the memory controller 120 may be configured to perform the group selection phase every time the command is transmitted.

Figure 12:
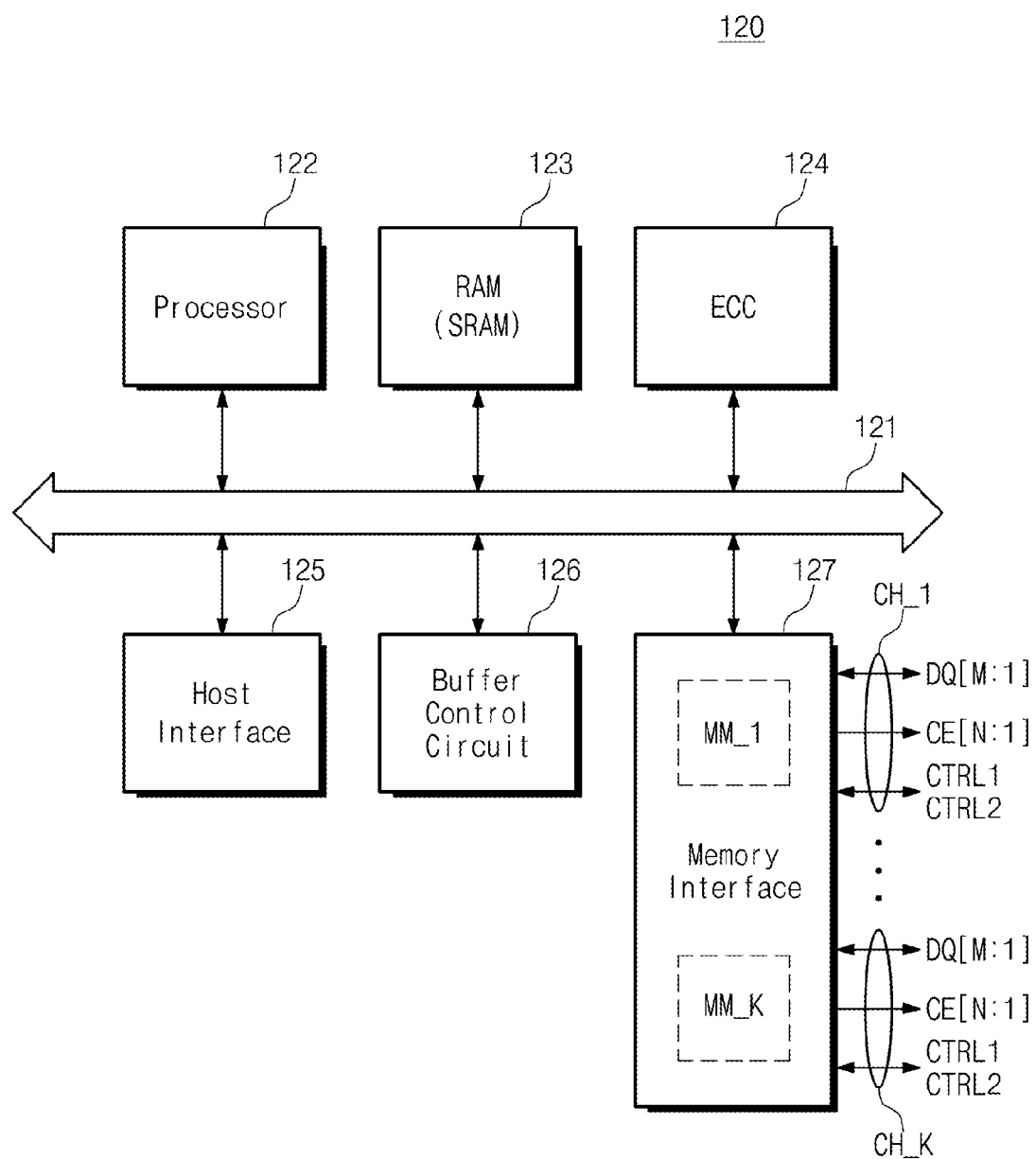
FIG. 12 is a flow chart illustrating an operation method of a storage device in accordance with example embodiments of inventive concepts.

FIG. 12 is a flow chart illustrating an operation method of a storage device in accordance with example embodiments of inventive concepts. Referring to FIG. 12, the memory controller 120 includes a bus 121, a processor 122, a RAM 123, an error correction block 124, a host interface 125, a buffer control circuit 126 and a memory interface 127.

The bus 121 is configured to provide a channel between constituent elements of the memory controller 120.

The processor 122 can control an overall operation of the memory controller 120 and perform a logical operation. The processor 122 can communicate with an external host device through the host interface 125. The processor 122 can store a host command or a host address received through the host interface 125 in the RAM 123. The processor 122 can generate a memory command and a memory address according to the host command or the host address and output the generated memory command and memory address through the memory interface 127.

The processor 122 may output data received through the host interface 125 through the buffer control circuit 126 or may store the data received through the host interface 125 in the RAM 123. Through the memory interface 127, the processor 122 can output the data stored in the RAM 123 or the data received through the buffer control circuit 126. The processor 122 may store the data received through the memory interface 127 in the RAM 123 or may output the data through the buffer control circuit 126. The processor 122 may output data stored in the RAM 123 or data received through the buffer control circuit 126 through the host interface 125 or may output the data through the memory interface 127.

The RAM 123 may be used as an operation memory, a cache memory or a buffer memory. The RAM 123 can store codes or commands which the processor 122 executes. The RAM 123 can store data processed by the processor 122. The RAM 123 may include a static RAM (SRAM).

The error correction block 124 can correct an error correction. The error correction block 124 can generate an error correction code (for example, parity) for performing an error correction on the basis of the first data DATA1 to be output to the memory interface 127 or the second data DATA2 received from the host interface 125. The first data DATA1 and the parity can be output through the memory interface 127. The error correction block 124 can perform an error correction of the received first data DATA1 using the first data DATA1 and the parity received through the memory interface 127. The error correction block 124 may be included in the memory interface 127 as a constituent element of the memory interface 127. The error correction block 124 may include a plurality of error correction sub-blocks provided to every channels CH_1~CH_K of the nonvolatile memory groups 110_1a~110_Ka and 110_1b~110_Kb.

The host interface 125 is configured to communicate with an external host device under the control of the processor 122. The host interface 125 can receive a host command and a host address from the external host device and can exchange data with the external host device.

The host interface 125 may be configured to communicate using at least one of various communication methods such as a universal serial bus (USB), a serial at attachment (SATA), a serial attached SCSI (SAS), a high speed interchip (HSIC), a small computer small interface (SCSI), a Firewire, a peripheral component interconnection (PCI), a PCI express (PCIe), a nonvolatile memory express (NVMe), a universal flash storage (UFS), a secure digital (SD), a multimedia card (MMC), an embedded MMC (eMMC), etc.

The buffer control circuit 126 is configured to control the RAM 130 under the control of the processor 122. The buffer control circuit 126 can write data in the RAM 130 and read data from the RAM 130.

The memory interface 127 is configured to communicate the nonvolatile memory groups 110_1a~110_ka and 110_1b~110_kb through the channels CH_1~CH_K under the control of the processor 122. The memory interface 127 includes a plurality of memory managers MM_1~MM_K corresponding to the channels CH_1~CH_K respectively. Each memory manager MM is configured to communicate first control signals CTRL1, second control signals CTRL2, first through Nth chip enable signals CE[N:1] and first through Mth input/output signals DQ[M:1] through an allocated channel CH. Each memory manager MM can control a group select circuit 140 belong to the allocated channel CH. As described with reference to FIG. 12, each memory manager MM is configured to perform a communication according to the group select phase, the command input phase, the address input phase and a data communication phase.

The RAM 130 may not be provided to the storage device 100. That is, the storage device 100 may not have a separate memory outside the memory controller 120 and the nonvolatile memory 110. At this time, the buffer control circuit 126 may not be provided to the memory controller 120. A function of the RAM 130 may be performed by an internal RAM 123 of the memory controller 120.

The processor 122 can control the memory controller 120 using codes. The processor 122 can load codes from a nonvolatile memory (e.g., a read only memory) provided to the inside of the memory controller 120. The processor 122 can load codes received from the memory interface 127.

The bus 121 of the memory controller 120 may be divided into a control bus and a data bus. The data bus may be configured to transmit data in the memory controller 120 and the control bus may be configured to transmit control information such as a command and an address in the memory controller 120. The data bus and the control bus may be separated from each other and may not interfere with or affect each other. The data bus may be connected to the host interface 125, the buffer control circuit 126, the error correction block 124 and the memory interface 127. The control bus may be connected to the host interface 125, the processor 122, the buffer control circuit 126, the RAM 123, and the memory interface 127.

Figure 13:
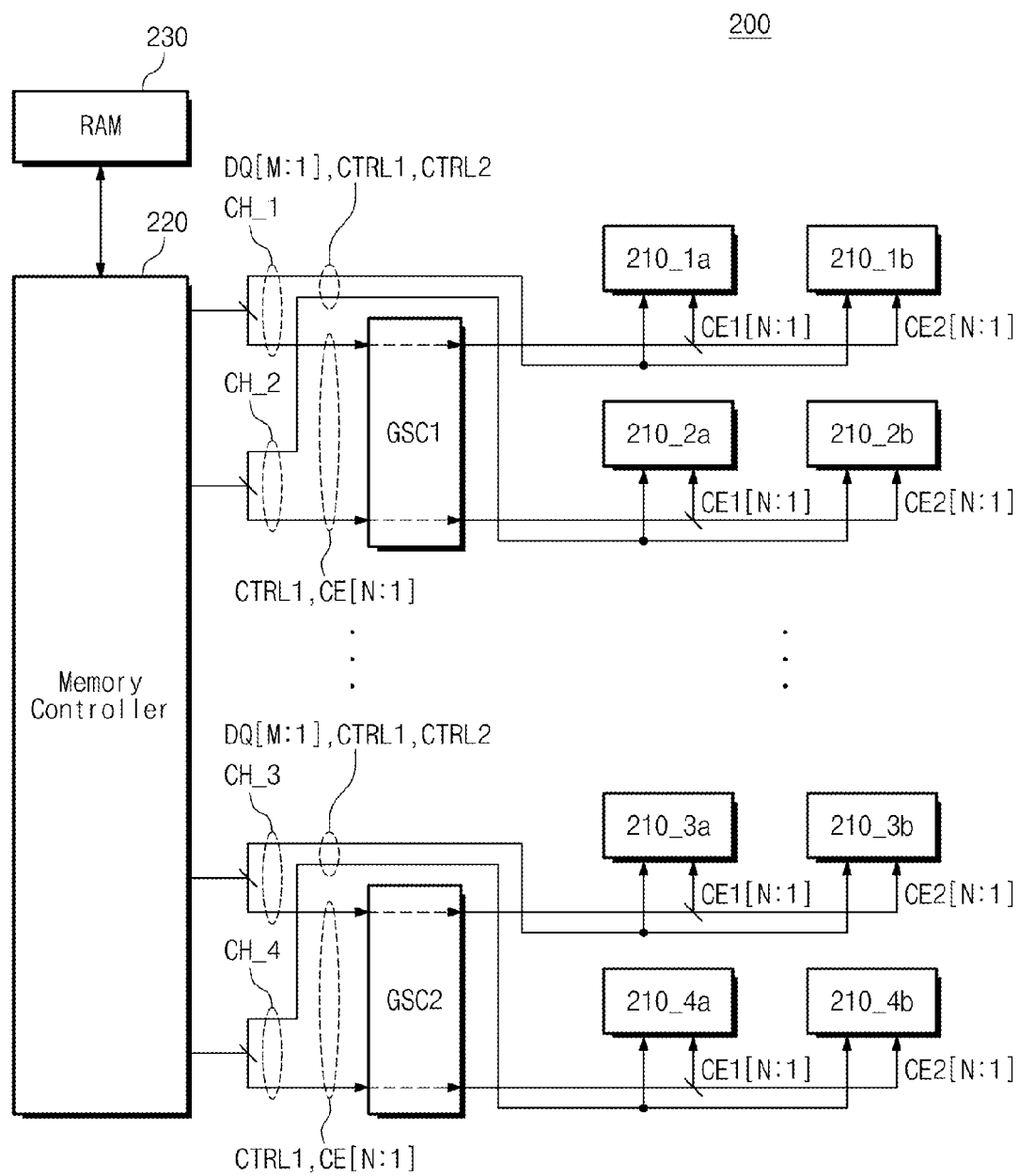
FIG. 13 is a block diagram illustrating a storage device in accordance with example embodiments of inventive concepts.

FIG. 13 is a block diagram illustrating a storage device 200 in accordance with example embodiments of inventive concepts. Referring to FIG. 13, the storage device 200 includes nonvolatile memory groups 210_1a~210_1b, 210_2a~210_2b, 210_3a~210_3b and 210_4a~210_4b, a memory controller 220, a RAM 230 and group select circuits GSC1 and GSC2.

In comparison with the storage device 100 of FIG. 1, each group select circuit GSC of the storage device 200 may be connected to two channels of the memory controller 220. For example, first and second channels CH1 and CH2 of the memory controller 220 may be connected to the first group select circuit GSC1 and third and fourth channels CH3 and CH4 of the memory controller 220 may be connected to the second group select circuit GSC2.

In the first channel CH1, first control signals CTRL1, second control signals CTRL2 and first through Mth input/output signals DQ[M:1] are transmitted to the nonvolatile memory groups 210_1a~210_1b, and the first control signals CTRL1 and first through Nth chip enable signals CE[N:1] are transmitted to the first group select circuit GSC1.

In the second channel CH2, the first control signals CTRL1, the second control signals CTRL2 and the first through Mth input/output signals DQ[M:1] are transmitted to the nonvolatile memory groups 210_2a~210_2b, and the first control signals CTRL1 and the first through Nth chip enable signals CE[N:1] are transmitted to the first group select circuit GSC1.

The first group select circuit GSC1 can transmit the first through Nth chip enable signals CE[N:1] from the first channel CH1 to one nonvolatile memory group among the nonvolatile memory groups 210_1a~210_1b of the first channel CH1 in response to the first through Nth chip enable signals CE[N:1] and the first control signals CTRL1 from the first channel CH1.

The first group select circuit GSC1 can also transmit the first through Nth chip enable signals CE[N:1] from the second channel CH2 to one nonvolatile memory group among the nonvolatile memory groups 210_2a~210_2b of the second channel CH2 in response to the first through Nth chip enable signals CE[N:1] and the first control signals CTRL1 from the second channel CH2.

The second group select circuit GSC2 of the third and fourth channels CH3 and CH4 operates similar to the first group select circuit GSC1 and thereby a description thereof is omitted.

According to example embodiments of inventive concepts, one group select circuit GSC is included in two channels CH. Thus, a manufacturing cost of the group select circuit GSC is reduced and an area occupied by the group select circuit GSC is reduced. That is, a manufacturing cost of the storage device 200 is reduced and an area of the storage device 200 is reduced.

Figure 14:
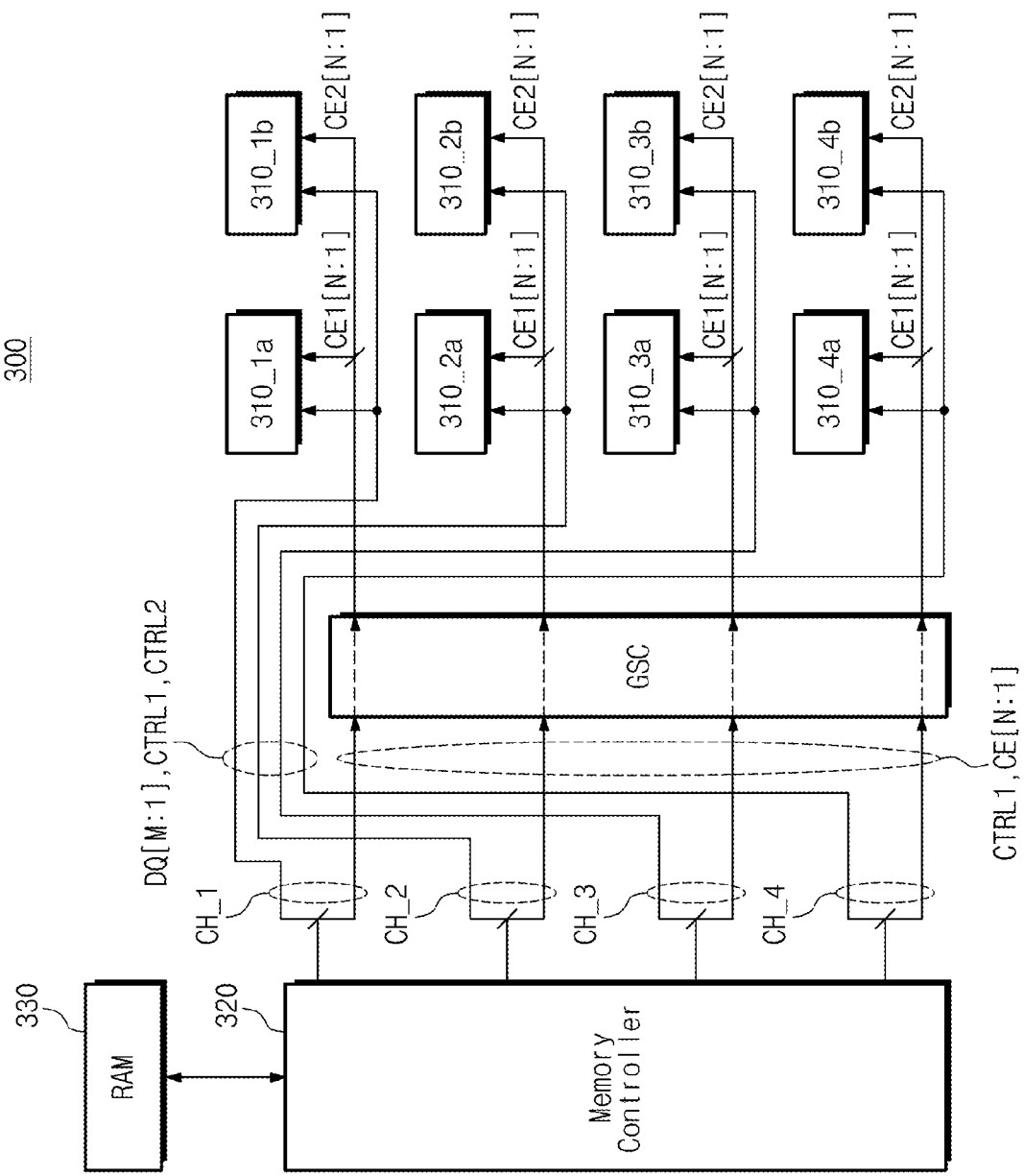
FIG. 14 is a block diagram illustrating a storage device in accordance with a second embodiment of inventive concepts.

FIG. 14 is a block diagram illustrating a storage device 300 in accordance with a second embodiment of inventive concepts. Referring to FIG. 14, the storage device 300 includes nonvolatile memory groups 310_1a~310_1b, 310_2a~310_2b, 310_3a~310_3b and 310_4a~310_4b and a group select circuit GSC.

In comparison with the storage device 100 of FIG. 1, the group select circuit GSC of the storage device 300 may be connected to four channels of a memory controller 320. For example, the first through fourth channels CH1~CH4 of the memory controller 320 may be connected to one group select circuit GSC.

In the first channel CH1, first control signals CTRL1, second control signals CTRL2 and first through Mth input/output signals DQ[M:1] are transmitted to the nonvolatile memory groups 310_1a~310_1b, and the first control signals CTRL1 and first through Nth chip enable signals CE[N:1] are transmitted to the group select circuit GSC.

In the second channel CH2, the first control signals CTRL1, the second control signals CTRL2 and the first through Mth input/output signals DQ[M:1] are transmitted to the nonvolatile memory groups 310_2a~310_2b, and the first control signals CTRL1 and the first through Nth chip enable signals CE[N:1] are transmitted to the group select circuit GSC.

In the third channel CH3, the first control signals CTRL1, the second control signals CTRL2 and the first through Mth input/output signals DQ[M:1] are transmitted to the nonvolatile memory groups 310_3a~310_3b, and the first control signals CTRL1 and the first through Nth chip enable signals CE[N:1] are transmitted to the group select circuit GSC.

In the fourth channel CH4, the first control signals CTRL1, the second control signals CTRL2 and the first through Mth input/output signals DQ[M:1] are transmitted to the nonvolatile memory groups 310_4a~310_4b, and the first control signals CTRL1 and the first through Nth chip enable signals CE[N:1] are transmitted to the group select circuit GSC.

The group select circuit GSC can transmit the first through Nth chip enable signals CE[N:1] from the first channel CH1 to one nonvolatile memory group among the nonvolatile memory groups 310_1a~310_1b of the first channel CH1 in response to the first through Nth chip enable signals CE[N:1] and the first control signals CTRL1 from the first channel CH1.

The group select circuit GSC can transmit the first through Nth chip enable signals CE[N:1] from the second channel CH2 to one nonvolatile memory group among the nonvolatile memory groups 310_2a~310_2b of the second channel CH2 in response to the first through Nth chip enable signals CE[N:1] and the first control signals CTRL1 from the second channel CH2.

The group select circuit GSC can transmit the first through Nth chip enable signals CE[N:1] from the third channel CH3 to one nonvolatile memory group among the nonvolatile memory groups 310_3a~310_3b of the third channel CH3 in response to the first through Nth chip enable signals CE[N:1] and the first control signals CTRL1 from the third channel CH3.

The group select circuit GSC can transmit the first through Nth chip enable signals CE[N:1] from the fourth channel CH4 to one nonvolatile memory group among the nonvolatile memory groups 310_4a~310_4b of the fourth channel CH4 in response to the first through Nth chip enable signals CE[N:1] and the first control signals CTRL1 from the fourth channel CH4.

In example embodiments of inventive concepts, the group select circuit GSC communicates with one channel, two channels or four channels of the memory controller. However, the number of channels of the memory controller that communicates with the group select circuit GSC is not limited.

Figure 15:
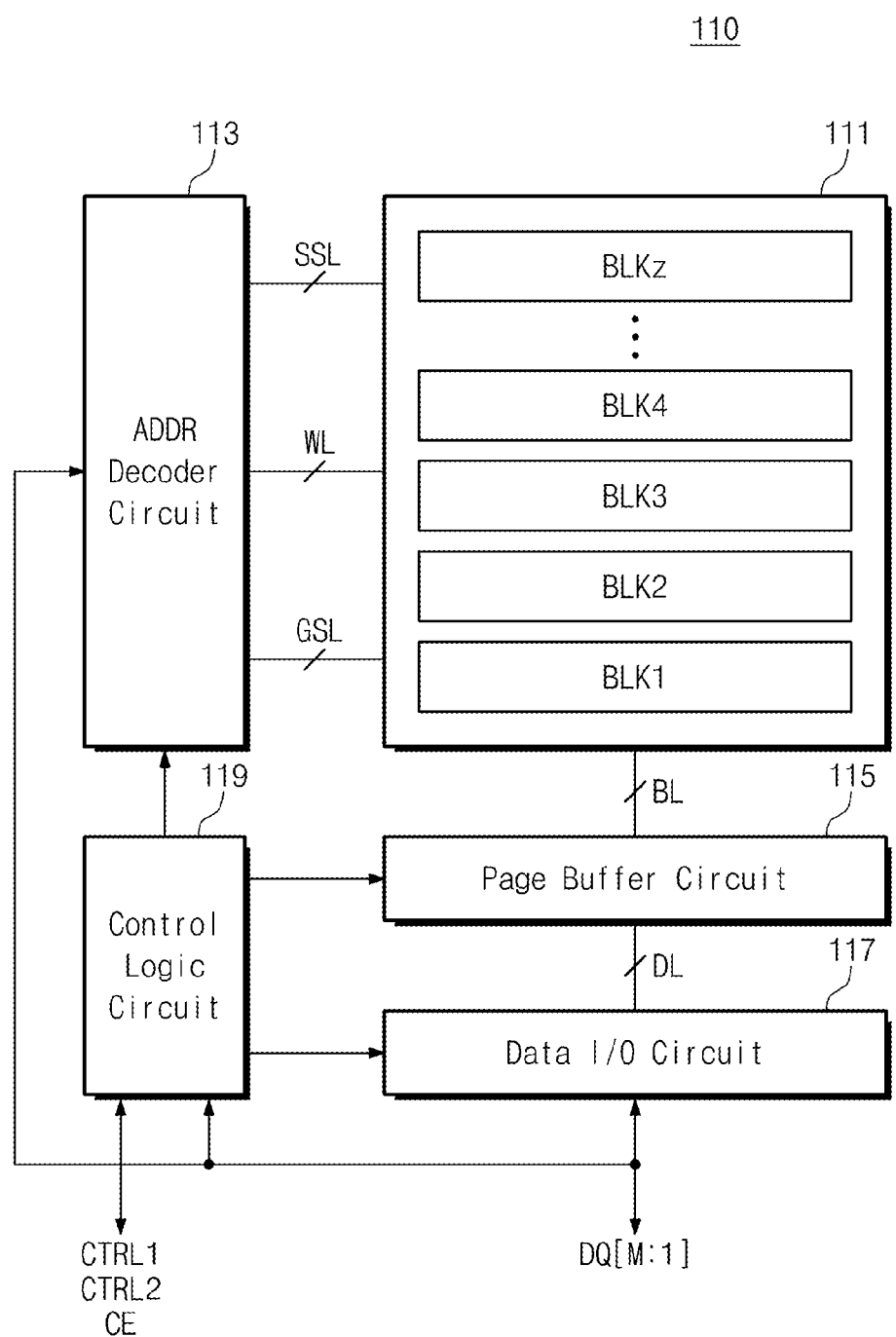
FIG. 15 is a block diagram illustrating a nonvolatile memory in accordance with example embodiments of inventive concepts.

FIG. 15 is a block diagram illustrating a nonvolatile memory 110 in accordance with example embodiments of inventive concepts. One nonvolatile memory chip among the nonvolatile memory chips of the nonvolatile memory group of FIG. 1, 13 or 14 is illustrated in FIG. 15.

Referring to FIGS. 1 and 15, the nonvolatile memory 110 includes a memory cell array 111, an address decoder circuit 113, a page buffer circuit 115, a data input/output circuit 117 and a control logic circuit 119.

The memory cell array 111 includes a plurality of memory blocks BLK1~BLKz. Each memory block includes a plurality of memory cells. Each memory block may be connected to the address decoder circuit 113 through at least one string select line SSL, a plurality of word lines WL and at least one ground select line GSL. Each memory block may be connected to the page buffer circuit 115 through a plurality of bit lines BL. The memory blocks BLK1~BLKz may be connected to a plurality of bit lines BL in common. Memory cells of the memory blocks BLK1~BLKz may have the same structure. Each of the memory blocks BLK1~BLKz may be an erase operation unit. Memory cells of the memory cell array 111 may be erased by a memory block unit. Memory cells included in one memory block may be erased at the same time. Each memory block may be divided into a plurality of sub blocks. Each sub block may be an erase operation unit.

The address decoder circuit 113 is connected to the memory cell array 111 through a plurality of ground select lines GSL, a plurality of word lines WL and a plurality of string select lines SSL. The address decoder circuit 113 operates according to a control of the memory control circuit 119. In an address input phase, the address decoder 113 can receive an address from the memory controller 120 as the first through Mth input/output signals DQ[M:1]. The address decoder circuit 113 can decode the received address and can control voltages applied to the word lines WL according to the decoded address.

For example, in a program operation, the address decoder circuit 113 may apply a program voltage VGPM to a selected word line of a selected memory block indicated by the address and may apply a pass voltage VPASS to unselected word lines of the selected memory block. In a read operation, the address decoder circuit 113 may apply a select read voltage VRD to the selected word line of the selected memory block indicated by the address and may apply an unselect read voltage VREAD to the unselected word lines of the selected memory block. In an erase operation, the address decoder circuit 113 may apply an erase voltage (for example, a ground voltage) to word lines of the selected memory block indicated by the address.

The page buffer circuit 115 is connected to the memory cell array 111 through the bit lines BL. The page buffer circuit 115 is connected to the data input/output circuit 117 through a plurality of data lines DL. The page buffer circuit 115 operates under the control of the control logic circuit 119.

The page buffer circuit 115 can store data to be programmed in memory cells of the memory cell array 111 or data read from the memory cells. In a program operation, the page buffer circuit 115 can store data to be programmed in the memory cells. The page buffer circuit 115 can bias the bit lines BL on the basis of the stored data. In the program operation, the page buffer circuit 115 may function as a write driver. In a read operation, the page buffer circuit 115 can sense voltages of the bit lines BL and can store a sensing result. In the read operation, the page buffer circuit 115 can function as a sense amplifier.

The data input/output circuit 117 is connected to the page buffer circuit 115 through the data lines DL. In a data communication phase, the data input/output circuit 117 can exchange the data with the memory controller 120 as the first through Mth input/output signals DQ[M:1].

The data input/output circuit 117 can temporarily store data received from the memory controller 120. The data input/output circuit 117 can transmit the stored data to the page buffer circuit 115. The data input/output circuit 117 can temporarily store data transmitted from the page buffer circuit 115. The data input/output circuit 117 can transmit the stored data to the memory controller 120. The data input/output circuit 117 can function as a buffer memory.

The control logic circuit 119 receives the first control signals CTRL1, the second control signals CTRL2 and the chip enable signal CE from the memory controller 120. In a command input phase, the control logic circuit 119 can receive a command from the memory controller 120 as the first through Mth input/output signals DQ[M:1].

The control logic circuit 119 can receive one chip enable signal CE among the first through Nth chip enable signals CE[N:1] transmitted to a nonvolatile memory group to which the nonvolatile memory device 110 belongs. If the enable signal are activated, the control logic circuit 119 can determine the command input phase, the address input phase or the data communication phase according to the first control signals CTRL1 and the second control signals CTRL2.

If it is determined that the first control signals CTRL1 and the second control signals CTRL2 indicate the command input phase, the control logic 119 can receive the first through Mth input/output signals DQ[M:1] and can decode the received first through Mth input/output signals DQ[M:1] to extract a command.

If it is determined that the first control signals CTRL1 and the second control signals CTRL2 indicate the address input phase, the control logic 119 can control so that the first through Mth input/output signals DQ[M:1] are transmitted to the address decoder circuit 113.

If it is determined that the first control signals CTRL1 and the second control signals CTRL2 indicate the data communication phase, the control logic 119 can control so that the first through Mth input/output signals DQ[M:1] are transmitted to the data input/output circuit 117.

Figure 16:
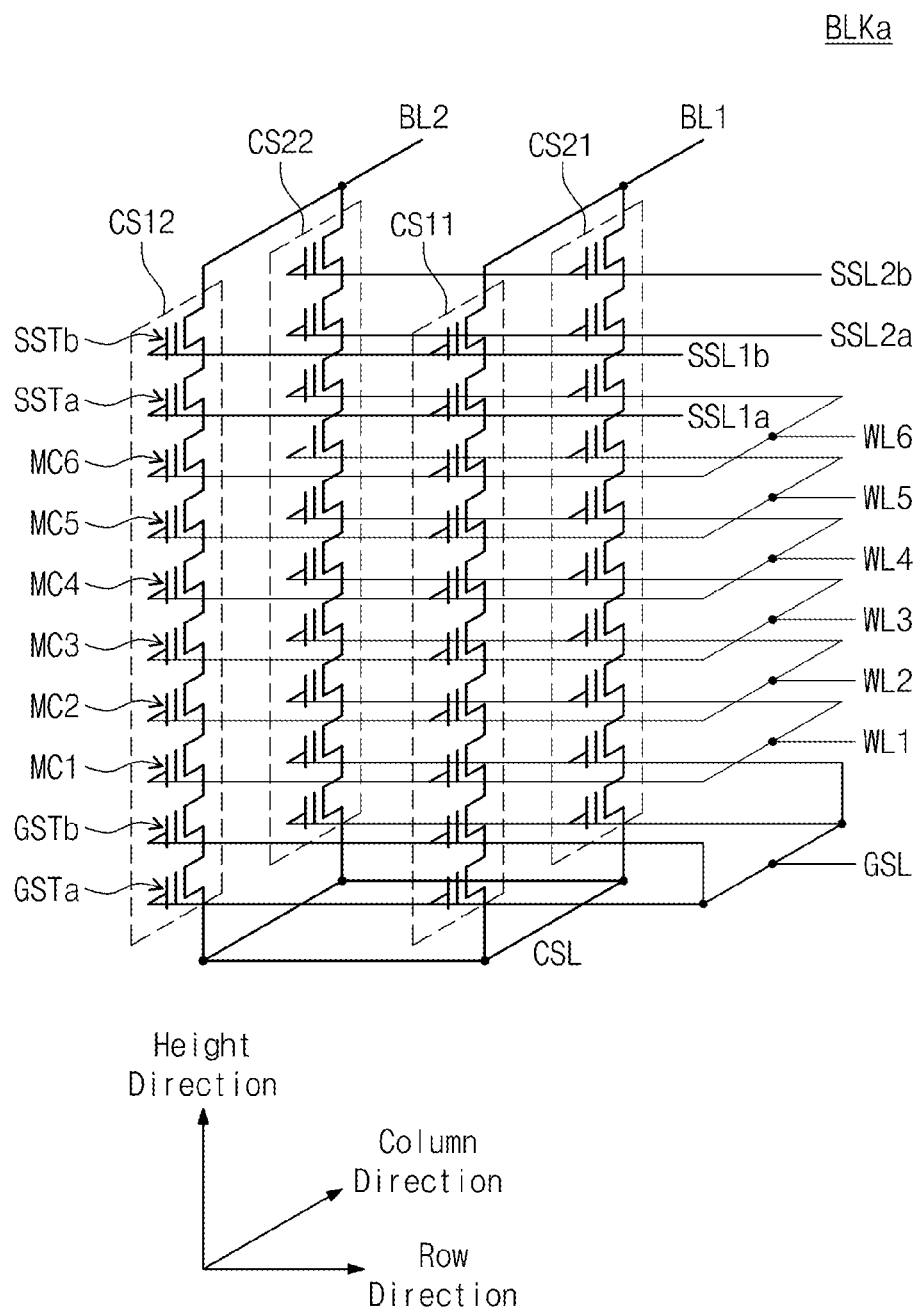
FIG. 16 is a circuit diagram illustrating a memory block in accordance with example embodiments of inventive concepts.

FIG. 16 is a circuit diagram illustrating a memory block BLKa in accordance with example embodiments of inventive concepts. Referring to FIG. 13, the memory block BLKa includes a plurality of cell strings CS11~CS21 and CS12~CS22. The cell strings CS11~CS21 and CS12~CS22 are arranged along a row direction and a column direction to form rows and columns.

For example, the cell strings CS11 and CS12 arranged along the row direction may form a first row and the cell strings CS21 and CS22 arranged along the row direction may form a second row. The cell strings CS11 and CS21 arranged along the column direction may form a first column and the cell strings CS12 and CS22 arranged along the column direction may form a second column.

Each cell string may include a plurality of cell transistors. The cell transistors include ground select transistors GSTa and GSTb, memory cells MC1~MC6 and string select transistors SSTa and SSTb. The ground select transistors GSTa and GSTb, the memory cells MC1~MC6 and the string select transistors SSTa and SSTb of each cell string may be stacked in a height direction perpendicular to a plane (for example, a plane on a substrate of the memory block BLKa) on which the cell strings CS11~CS21 and CS12~CS22 are arranged along the row direction and the column direction.

The cell transistors may be charge trap transistors having threshold voltages that vary according to a quantity of charges trapped in an insulating layer.

The lowermost ground select transistors GSTa may be connected to a common source line CSL in common.

The ground select transistors GSTa and GSTb of the cell strings CS11~CS21 and CS12~CS22 may be connected to the ground select line GSL in common.

Ground select transistors of the same height (or order) may be connected to the same ground select line and ground select transistors of different heights may be connected to the different ground select lines. For example, the ground select transistors GSTa of a first height may be connected to a first ground select line in common and the ground select transistors GSTb of a second height may be connected to a second ground select line in common.

Ground select transistors of the same row may be connected to the same ground select line and ground select transistors of different rows may be connected to different ground select lines. For example, the ground select transistors GSTa and GSTb of the cell strings CS11 and CS12 of the first row may be connected to the first ground line and the ground select transistors GSTa and GSTb of the cell strings CS21 and CS22 of the second row may be connected to the second ground line.

Memory cells located at the same height (or order) from the substrate (or the ground select transistors GST) may be connected to one word line in common and memory cells located at different heights (or orders) may be connected to different word lines respectively. For example, the memory cells MC1 are connected to a word line WL1 in common. The memory cells MC2 are connected to a word line WL2 in common. The memory cells MC3 are connected to a word line WL3 in common. The memory cells MC4 are connected to a word line WL4 in common. The memory cells MC5 are connected to a word line WL5 in common. The memory cells MC6 are connected to a word line WL6 in common.

In the first string select transistors SSTa of the same height of the cell strings CS11~CS21 and CS12~CS22, the first string select transistors SSTa of different rows are connected to different string select lines SSL1a and SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

In the second string select transistors SSTb of the same height of the cell strings CS11~CS21 and CS12~CS22, the second string select transistors SSTb of different rows are connected to different string select lines SSL1b and SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

That is, cell strings of different rows are connected to different string select lines. String select transistors of the same height (or order) of cell strings of the same row are connected to the same string select line. String select transistors of different heights (or orders) of cell strings of the same row are connected to different string select lines.

String select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings CS11~CS21 and CS12~CS22 are connected to different bit lines BL1 and BL2 respectively. For example, the string select transistors SSTb of the cell strings CS11 and CS21 of the first column are connected to the bit line BL1 in common. The string select transistors SSTb of the cell strings CS12 and CS22 of the second column are connected to the bit line BL2 in common.

The cell strings CS11 and CS12 may form a first plane. The cell strings CS21 and CS22 may form a second plane.

In the memory block BLKa, write and read operations may be performed by a row unit. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit line BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit line BL1 and BL2. That is, the second plane is selected. In the selected plane, one row of the memory cells MC may be selected by the word lines WL1~WL6. In the selected row, a read or write operation may be performed.

In the memory block BLKa, an erase operation may be performed by a block unit or a sub block unit. When an erase operation is performed by a memory block unit, all the memory cells MC of the memory block BLKa may be erased at the same time by one erase request. When an erase operation is performed by a sub block unit, a part of the memory cells MC may be erased at the same time by one erase request and the other part of the memory cells MC may be erase-prohibited. A low voltage (for example, a ground voltage) is supplied to a word line connected to memory cells erased and a word line connected to erase-prohibited memory cells may be floated.

The memory block BLKa illustrated in FIG. 16 is illustrative. A technical spirit of inventive concepts is not limited to the memory block BLKa illustrated in FIG. 16. For example, the number of rows of the cell strings may increase or decrease. As the number of rows of the cell strings is changed, the number of string select lines or ground select lines connected to rows of the cell strings and the number of cell strings connected to one bit line may also be changed.

The number of columns of the cell strings may increase or decrease. As the number of columns of the cell strings is changed, the number of bit lines connected to columns of the cell strings and the number of cell strings connected to one string select line may also be changed.

A height of the cell strings may increase or decrease. For example, the number of ground select transistors, memory cells and string select transistors stacked on the respective cell strings may increase or decrease.

In example embodiments, a nonvolatile memory may be embodied to include a three dimensional (3D) memory array. The 3D memory array may be monolithically formed on a substrate (e.g., semiconductor substrate such as silicon, or semiconductor-on-insulator substrate). The 3D memory array may include two or more physical levels of memory cells having an active area disposed above the substrate and circuitry associated with the operation of those memory cells, whether such associated circuitry is above or within such substrate. The layers of each level of the array may be directly deposited on the layers of each underlying level of the array.

In example embodiments, the 3D memory array may include vertical NAND strings that are vertically oriented such that at least one memory cell is located over another memory cell. The at least one memory cell may comprise a charge trap layer.

The following patent documents, which are hereby incorporated by reference in their entirety, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 17:
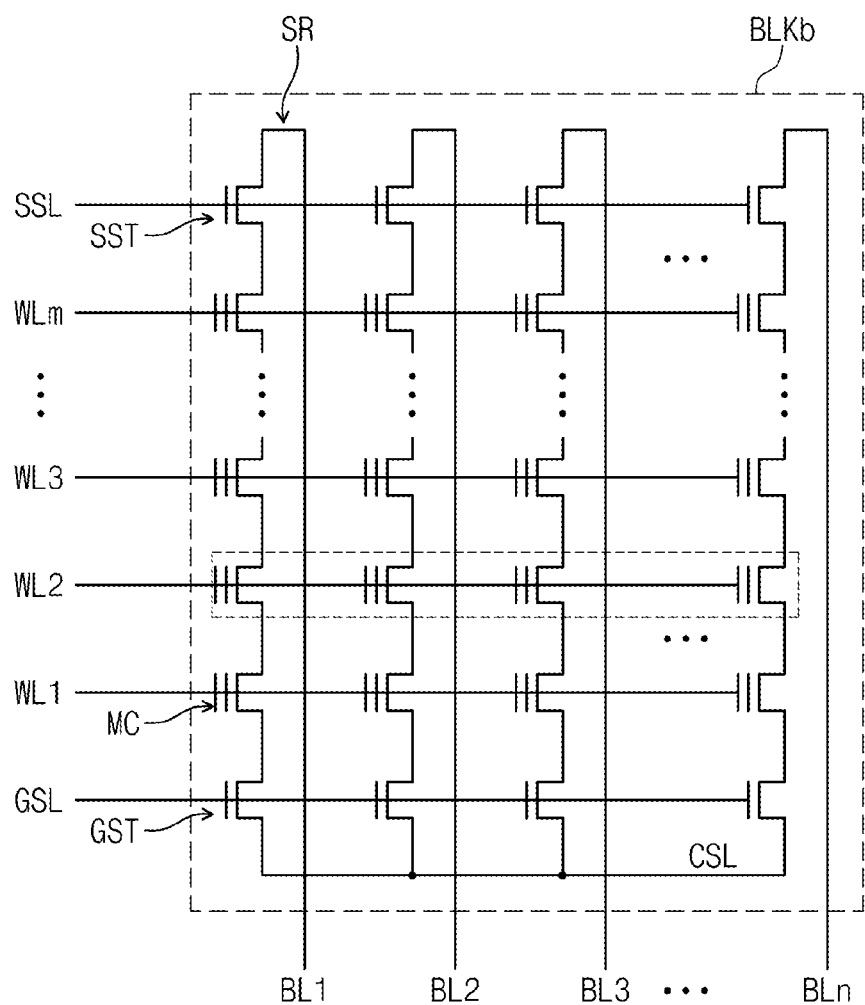
FIG. 17 is a circuit diagram illustrating a memory block in accordance with example embodiments of inventive concepts.

FIG. 17 is a circuit diagram illustrating a memory block BLKb in accordance with example embodiments of inventive concepts. Referring to FIG. 17, the memory block BLKb includes a plurality of strings SR. The strings SR may be connected to a plurality of bit lines BL1~BLn respectively. Each string SR includes a ground select transistor GST, memory cells MC and a string select transistor SST.

The ground select transistor GST of each string SR is connected between the memory cells MC and a common source line CSL. The ground select transistors GST of the strings SR are connected to the common source line CSL in common.

The string select transistor SST of each string SR is connected between the memory cells MC and the bit line BL. The string select transistors SST of the strings SR are connected to the bit lines BL1~BLn respectively.

In each string SR, the memory cells MC are provided between the ground select transistor GST and the string select transistor SST. In each string SR, the memory cells MC may be serially connected to one another.

In the strings SR, memory cells MC located at the same order from the common source line CSL may be connected to one word line in common. Memory cells MC of the strings SR may be connected to a plurality of word lines WL1~WLm.

In the memory block BLKb, an erase operation may be performed by a memory block unit. When an erase operation is performed by a memory block unit, all the memory cells MC of the memory block BLKb may be erased at the same time by one erase request.

Figure 18:
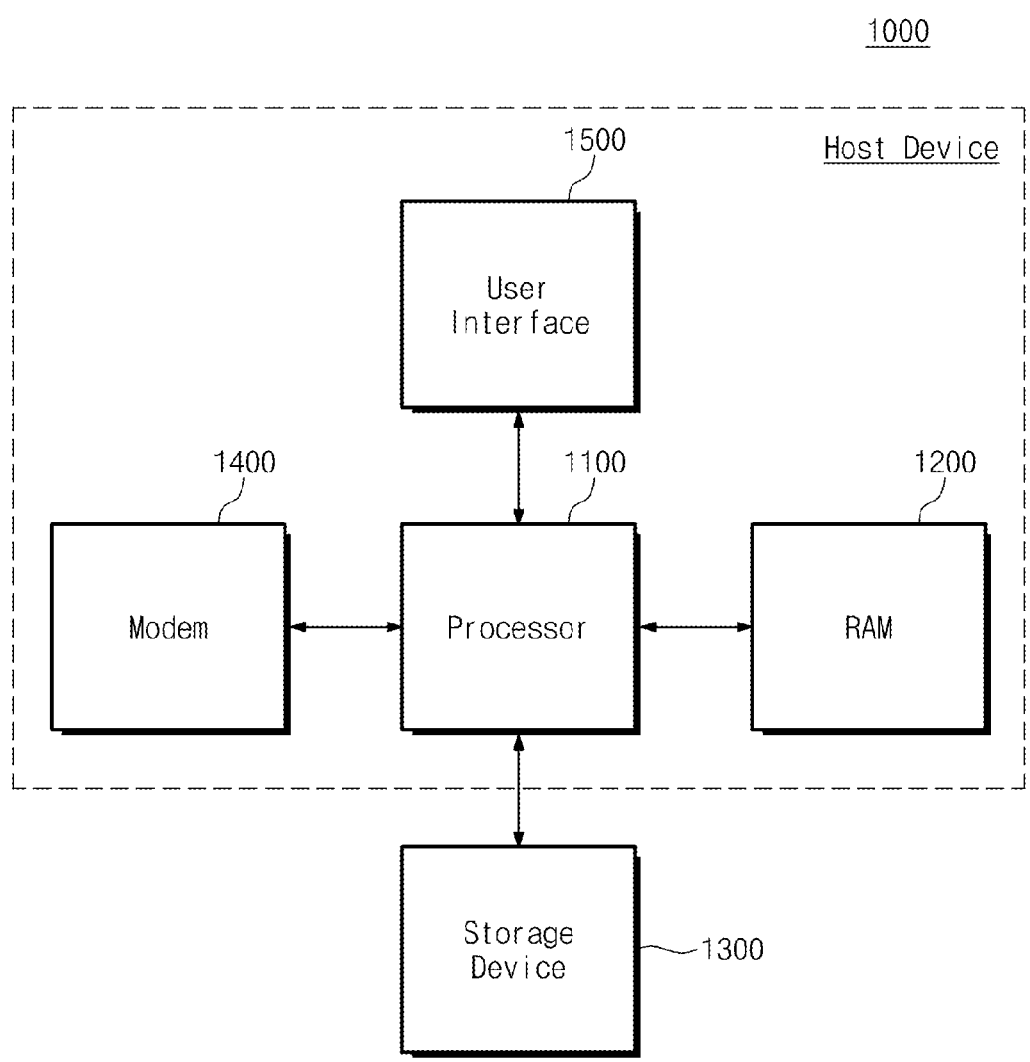
FIG. 18 is a block diagram illustrating a computing device in accordance with example embodiments of inventive concepts.

FIG. 18 is a block diagram illustrating a computing device 1000 in accordance with example embodiments of inventive concepts. Referring to FIG. 18, the computing device 1000 includes a processor 1100, a memory 1200, a storage device 1300, a modem 1400, and a user interface 1500.

The processor 1100 can control an overall operation of the computing device 1000 and perform a logical operation. For example, the processor 1100 may be constituted by a system-on-chip. The processor 1100 may be a general-purpose processor, a special-purpose processor or an application processor.

The RAM 1200 can communicate with the processor 1100. The RAM 1200 may be a main memory of the processor 1100 or the computing device 1000. The processor 1000 can temporarily store a code or data in the RAM 1200.

The processor 1100 can execute a code and process data using the RAM 1200. The processor 1100 can execute various software such as an operating system and an application using the RAM 1200. The processor 1100 can control an overall operation of the computing device 1000 using the RAM 1200. The RAM 1200 may include a volatile memory such as a static RAM (SRAM), a dynamic RAM (DRAM), a synchronous DRAM (SDRAM), etc. and a nonvolatile memory such as a phase-change RAM (PRAM), a magnetic RAM (MRAM), a resistive RAM (RRAM), a ferroelectric RAM (FRAM), etc.

The storage device 1300 can communicate with the processor 1100. The storage device 1300 can store data that needs to be preserved for a long period of time. That is, the processor 1100 can store the data that needs to be preserved for a long period of time in the storage device 1300. The storage device 1300 can store a boot image for driving the computing device 1000. The storage device 1300 can store source codes of various software such as an operating system and an application. The storage device 1300 can store data processed by various software such as an operating system and an application.

The processor 1100 can drive various software such as an operating system and an application by loading source codes stored in the storage device 1300 in the RAM 1200 and executing the source codes loaded in the RAM 1200. The processor 1100 can load data stored in the storage device 1300 in the RAM 1200 and can process the data loaded in the RAM 1200. The processor 1100 can store data that needs to be preserved for a long period of time among data stored in the RAM 1200 in the storage device 1300.

The storage device 1300 may include a nonvolatile memory such as a flash, a PRAM (phase-change RAM), a MRAM (magnetic RAM), an RRAM (resistive RAM), a FRAM (ferroelectric RAM), etc.

The modem 1400 can perform a communication with an external device under the control of the processor 1100. For example, the modem 1400 can perform a wired or wireless communication with the external device. The modem 1400 can perform a wired or wireless communication with an external device. The modem 140 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), a PCI express (PCIe), a nonvolatile memory express (NVMe), a universal flash storage (UFS), a secure digital (SD), a SDIO, a universal asynchronous receiver transmitter (UART), a SPI (serial peripheral interface), a high speed SPI (HS-SPI), a RS232, an inter-integrated circuit (I2C), a HS-I2C, an integrated-interchip sound (I2S), a Sony/Philips digital interface (S/PDIF), a multimedia card (MMC), an embedded MMC (eMMC), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, etc. The user interface 1500 may include user output interfaces such as a liquid crystal display (LCD), an organic light emitting diode (OLED) display, an active matrix OLED (AMOLED) display, a LED, a speaker, a motor, etc.

The storage device 1300 may include at least one of the storage devices 100, 200 and 300 in accordance with some embodiments of inventive concepts. The processor 1100, the RAM 1200, the modem 1400 and the user interface 1500 can form a host device communicating with the storage device 1300.

According to example embodiments of inventive concepts, chip enable signals output from a memory controller are transmitted to one of a plurality of nonvolatile memory groups by a group select circuit. Thus, without changing a design of the memory controller and increasing a size of the memory controller, the number of nonvolatile memory chips accessed by the memory controller increases. That is, a high-capacity storage device of a low cost, low complexity and a small size is provided.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A storage device comprising:
   a first nonvolatile memory group including a plurality of first nonvolatile memory chips;
   a second nonvolatile memory group including a plurality of second nonvolatile memory chips;
   a memory controller connected to the first nonvolatile memory group and the second nonvolatile memory group in common through a plurality of input/output lines and at least one control line that are each connected to both the first nonvolatile memory group and the second nonvolatile memory group; and
   a group select circuit connected to the memory controller through the at least one control line and a plurality of chip enable lines,
      the group select circuit connected to the first nonvolatile memory group through a plurality of first chip enable lines,
      the group select circuit connected to the second nonvolatile memory group through a plurality of second chip enable lines,
      the group select circuit, in response to receiving a control signal through the at least one control line, being configured to transmit chip enable signals to a selected memory group among either one of the first nonvolatile memory group and the second nonvolatile memory group,
      the group select circuit being configured to transmit the chip enable signals to the selected memory group through selected chip enable lines among the first chip enable lines and the second chip enable lines,
   wherein the memory controller is configured to select one of the first and second nonvolatile memory groups using the at least one control line and then control communication with the selected one of the first and second nonvolatile memory groups through the plurality of input/output lines using the at least one control line.

2. The storage device of claim 1, wherein
the memory controller is configured to drive the at least one control line according to a first pattern when accessing one of the first nonvolatile memory group and the second nonvolatile memory group,
the memory controller is configured to drive the at least one control line according to a second pattern when controlling the group select circuit, and
the second pattern is different from the first pattern.

3. The storage device of claim 2, wherein the first nonvolatile memory group and the second nonvolatile memory group are configured to ignore signals transmitted through the at least one control line when the at least one control line is driven according to the second pattern.

4. The storage device of claim 1, wherein
the at least one control line includes a command latch enable line and an address latch enable line,
the memory controller is configured to transmit a command latch enable signal to the first nonvolatile memory group and the second nonvolatile memory group through the command latch enable line, and
the memory controller is configured to transmit the address latch enable signal to the first nonvolatile memory group and the second nonvolatile memory group through the address latch enable signal line.

5. The storage device of claim 4, wherein the memory controller is configured to activate only one of the command latch enable signal and the address latch enable signal at once when accessing the first nonvolatile memory group and the second nonvolatile memory group.

6. The storage device of claim 4, wherein the memory controller is configured to activate both the command latch enable signal and the address latch enable signal at once when accessing the group select circuit.

7. The storage device of claim 4, wherein
the at least one control line further includes a write enable line,
the memory controller is configured to transmit a write enable signal to the first nonvolatile memory group and the second nonvolatile memory group through the write enable line, and
when accessing the group select circuit, the memory controller is configured to drive both the command latch enable signal and the address latch enable signal in an activation state and to output information indicating one of the first nonvolatile memory group and the second nonvolatile memory group through the chip enable lines in synchronization with the write enable signal.

8. The storage device of claim 4, wherein when accessing the group select circuit, the memory controller is configured to drive both the command latch enable signal and the address latch enable signal in an activation state and output information indicating one of the first nonvolatile memory group and the second nonvolatile memory group through the chip enable lines in synchronization with a concurrent activation of the command latch enable signal and the address latch enable signal.

9. The storage device of claim 4, wherein
the at least one control line further includes a clock line,
the memory controller is configured to transmit a clock signal through the clock line to the first nonvolatile memory group and the second nonvolatile memory group, and
when accessing the group select circuit, the memory controller is configured to drive both the command latch enable signal and the address latch enable signal in an activation state within one cycle of the clock signal and to control a duty ratio that the command latch enable signal and the address latch enable signal are in the activation state within one cycle to indicate one of the first nonvolatile memory group and the second nonvolatile memory group.

10. The storage device of claim 4, wherein
the at least one control line further includes a clock line,
the memory controller is configured to transmit a clock signal through the clock line to the first nonvolatile memory group and the second nonvolatile memory group, and
when accessing the group select circuit, the memory controller is configured to drive both the command latch enable signal and the address latch enable signal in an activation state within one cycle of the clock signal and control a time when the command latch enable signal and the address latch enable signal are activated within one cycle to indicate one of the first nonvolatile memory group and the second nonvolatile memory group.

11. The storage device of claim 1, wherein the memory controller is configured to control the group select circuit so that the group select circuit selects a group that is an access target between the first nonvolatile memory group and the second nonvolatile memory group.

12. The storage device of claim 1, wherein in the case that a group selected by the group select circuit between the first nonvolatile memory group and the second nonvolatile memory group is different from an access target, the memory controller is configured to control the group select circuit so that the group select circuit selects a group that is the access target.

13. The storage device of claim 1, wherein the memory controller is configured to transmit a command and an address to the first nonvolatile memory group or the second nonvolatile memory group through the plurality of input/output lines.

14. A storage device comprising:
a plurality of first nonvolatile memory chips;
a plurality of second nonvolatile memory chips;
a memory controller connected to the first nonvolatile memory chips and the second nonvolatile memory chips in common through a plurality of input/output lines and at least one control line that are each connected to both the first nonvolatile memory chips and the second nonvolatile memory chips; and
a group select circuit connected to the memory controller through a plurality of chip enable lines and the at least one control line,
the group select circuit, under the control of the memory controller, being configured to electrically connect the chip enable lines to selected nonvolatile memory chips among either one of the first nonvolatile memory chips and the second nonvolatile memory, and
the memory controller being configured to communicate with the selected nonvolatile memory chips through the input/output lines,
wherein the memory controller is configured to select one of the first nonvolatile memory chips and the second nonvolatile memory chips using the at least one control line, and then control communication with the selected one of the first nonvolatile memory chips and the second nonvolatile memory chips through the plurality of input/output lines using the at least one control line.

15. The storage device of claim 14, wherein the memory controller is configured to control the group select circuit through the at least one control line connected to the memory controller, the group select circuit, the first nonvolatile memory chips and the second nonvolatile memory chips in common.

16. A storage device comprising:
a first nonvolatile memory group including a plurality of first nonvolatile memory chips;
a second nonvolatile memory group including a plurality of second nonvolatile memory chips;
a memory controller connected to the first nonvolatile memory group and the second nonvolatile memory group in common through first control lines, second control lines, and a plurality of input/output lines that are connected to both the first nonvolatile memory group and the second nonvolatile memory group; and
a group select circuit connected to the memory controller through chip enable lines,
the group select circuit connected to the first nonvolatile memory group through first chip enable lines,
the group select circuit connected to the second nonvolatile memory group through second chip enable lines,
the group select circuit being configured to receive chip enable signals from the memory controller through the chip enable lines, and
the group select circuit being configured to route the chip enable signals to a selected nonvolatile memory group among either one of the first nonvolatile memory group and the second nonvolatile memory group while the chip enable signals are not routed to an unselected nonvolatile memory group among the first nonvolatile memory group and the second nonvolatile memory group, based on a control signal received through the first control lines,
wherein the memory controller is configured to select one of the first and second nonvolatile memory groups using the first control lines, and then control communication with the selected one of the first and second nonvolatile memory groups through the plurality of input/output lines using the first control lines and the second control lines.

17. The storage device of claim 16, wherein the memory controller is configured to activate a selected memory chip in the selected memory block based on driving the chip enable signals to the selected memory block through the group select circuit.

18. The storage device of claim 17, wherein the selected memory chip is configured to extract a memory command based on first control signals, second control signals, and input/output signals transmitted from the memory controller to the selected memory chip.

19. The storage device of claim 16, wherein
the memory controller is configured to transmit a command latch enable signal, an address enable signal, and a write enable signal to the selected nonvolatile memory group through the first control lines,
the group select circuit is configured to extract select information from the chip enable signals in synchronization with a rising edge of the write enable signal in a state where the command latch enable signal and the address enable signal are all activated, and
the group select circuit is configured to output the extracted select information to the selected nonvolatile memory group.

20. The storage device of claim 16, wherein
the first nonvolatile memory chips and the second nonvolatile memory chips each include a plurality of memory blocks,
each of the memory blocks includes a plurality of cell strings arranged in rows and columns,
each of the cell strings includes a plurality of memory cells stacked on top of each other between a ground selection line and a string selection line,
the cell strings in a same column are connected to a same bit line in common, and
the cell strings in a same row are connected in common to corresponding word lines.

* * * * *